United States Patent
Farrar

(10) Patent No.: US 7,535,103 B2
(45) Date of Patent: May 19, 2009

(54) STRUCTURES AND METHODS TO ENHANCE COPPER METALLIZATION

(75) Inventor: Paul A. Farrar, So. Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 232 days.

(21) Appl. No.: 11/458,195

(22) Filed: Jul. 18, 2006

(65) Prior Publication Data

US 2006/0255462 A1  Nov. 16, 2006

Related U.S. Application Data

(62) Division of application No. 10/854,552, filed on May 26, 2004, which is a division of application No. 10/196,081, filed on Jul. 16, 2002, now Pat. No. 7,378,737, which is a division of application No. 09/483,869, filed on Jan. 18, 2000, now Pat. No. 6,420,262.

(51) Int. Cl.
*H01L 23/52* (2006.01)

(52) U.S. Cl. ........................ 257/750; 438/637

(58) Field of Classification Search .................. 257/750
See application file for complete search history.

(56) References Cited

U.S. PATENT DOCUMENTS

| | | | |
|---|---|---|---|
| 2,842,438 A | 7/1958 | Saarivirta et al. |
| 3,515,663 A | 6/1970 | Bodway |
| 3,954,570 A | 5/1976 | Shirk et al. |
| 4,213,818 A | 7/1980 | Lemons et al. |
| 4,386,116 A | 5/1983 | Nair et al. |
| 4,394,223 A | 7/1983 | Hall |
| 4,423,547 A | 1/1984 | Farrar et al. |
| 4,565,157 A | 1/1986 | Brors et al. |
| 4,574,095 A | 3/1986 | Baum et al. |
| 4,762,728 A | 8/1988 | Keyser et al. |
| 4,788,082 A | 11/1988 | Schmitt |
| 4,824,544 A | 4/1989 | Mikalesen et al. |
| 4,847,111 A | 7/1989 | Chow et al. |
| 4,931,410 A | 6/1990 | Tokunaga et al. |

(Continued)

FOREIGN PATENT DOCUMENTS

EP  0304046  2/1989

(Continued)

OTHER PUBLICATIONS

*Machine Translation of* 05-295533, http://www4.ipdl.ncipi.go.jp/cgi-bin/tran_web_cgi_ejje?,2.

(Continued)

Primary Examiner—Thao P. Le
(74) Attorney, Agent, or Firm—Schwegman, Lundberg & Woessner, P.A.

(57) ABSTRACT

Disclosed structures and methods inhibit atomic migration and related capacitive-resistive effects between a metallization layer and an insulator layer in a semiconductor structure. One exemplary structure includes an inhibiting layer between an insulator and a metallization layer. The insulator includes a polymer or an insulating oxide compound. And, the inhibiting layer has a compound formed from a reaction between the polymer or insulating oxide compound and a transition metal, a representative metal, or a metalloid.

21 Claims, 12 Drawing Sheets

U.S. PATENT DOCUMENTS

| | | |
|---|---|---|
| 4,933,743 A | 6/1990 | Thomas et al. |
| 4,948,459 A | 8/1990 | Van Laarhoven et al. |
| 4,962,058 A | 10/1990 | Cronin et al. |
| 4,990,229 A | 2/1991 | Campbell et al. |
| 4,996,584 A | 2/1991 | Young et al. |
| 5,019,531 A | 5/1991 | Awaya et al. |
| 5,034,799 A | 7/1991 | Tomita et al. |
| 5,071,518 A | 12/1991 | Pan |
| 5,084,412 A | 1/1992 | Nakasaki |
| 5,100,499 A | 3/1992 | Douglas |
| 5,130,274 A | 7/1992 | Harper et al. |
| 5,149,615 A | 9/1992 | Chakravorty et al. |
| 5,158,986 A | 10/1992 | Cha et al. |
| 5,171,712 A | 12/1992 | Wang et al. |
| 5,173,442 A | 12/1992 | Carey |
| 5,209,987 A | 5/1993 | Penneck et al. |
| 5,231,056 A | 7/1993 | Sandhu |
| 5,240,878 A | 8/1993 | Fitzsimmons et al. |
| 5,243,222 A | 9/1993 | Harper et al. |
| 5,256,205 A | 10/1993 | Schmitt, III et al. |
| 5,310,580 A | 5/1994 | O'Sullivan et al. |
| 5,334,356 A | 8/1994 | Baldwin et al. |
| 5,348,811 A | 9/1994 | Nagao et al. |
| 5,354,712 A | 10/1994 | Ho et al. |
| 5,371,042 A | 12/1994 | Ong |
| 5,374,849 A | 12/1994 | Tada |
| 5,384,284 A | 1/1995 | Doan et al. |
| 5,401,680 A | 3/1995 | Abt et al. |
| 5,413,687 A | 5/1995 | Barton et al. |
| 5,426,330 A | 6/1995 | Joshi et al. |
| 5,442,237 A | 8/1995 | Hughes et al. |
| 5,447,887 A | 9/1995 | Filipiak et al. |
| 5,451,804 A | 9/1995 | Lur et al. |
| 5,461,243 A | 10/1995 | Ek et al. |
| 5,470,789 A | 11/1995 | Misawa |
| 5,470,801 A | 11/1995 | Kapoor et al. |
| 5,476,817 A | 12/1995 | Numata |
| 5,495,667 A | 3/1996 | Farnworth et al. |
| 5,506,449 A | 4/1996 | Nakano et al. |
| 5,529,956 A | 6/1996 | Morishita |
| 5,538,922 A | 7/1996 | Cooper et al. |
| 5,539,060 A | 7/1996 | Tsunogae et al. |
| 5,595,937 A | 1/1997 | Mikagi |
| 5,609,721 A | 3/1997 | Tsukune et al. |
| 5,625,232 A | 4/1997 | Numata et al. |
| 5,625,233 A | 4/1997 | Cabral, Jr. et al. |
| 5,633,200 A | 5/1997 | Hu |
| 5,635,253 A | 6/1997 | Canaperi et al. |
| 5,635,423 A | 6/1997 | Huang et al. |
| 5,654,245 A | 8/1997 | Allen |
| 5,662,788 A | 9/1997 | Sandhu et al. |
| 5,670,420 A | 9/1997 | Choi |
| 5,674,787 A | 10/1997 | Zhao et al. |
| 5,675,187 A | 10/1997 | Numata et al. |
| 5,679,608 A | 10/1997 | Cheung et al. |
| 5,681,441 A | 10/1997 | Svendsen et al. |
| 5,693,563 A | 12/1997 | Teong |
| 5,695,810 A | 12/1997 | Dubin et al. |
| 5,719,089 A | 2/1998 | Cherng et al. |
| 5,719,410 A | 2/1998 | Suehiro et al. |
| 5,719,447 A | 2/1998 | Gardner |
| 5,739,579 A | 4/1998 | Chiang et al. |
| 5,763,953 A | 6/1998 | Iljima et al. |
| 5,780,358 A | 7/1998 | Zhou et al. |
| 5,785,570 A | 7/1998 | Bruni |
| 5,789,264 A | 8/1998 | Chung |
| 5,792,522 A | 8/1998 | Jin et al. |
| 5,801,098 A | 9/1998 | Fiordalice et al. |
| 5,814,557 A | 9/1998 | Venkatraman et al. |
| 5,821,168 A | 10/1998 | Jain |
| 5,824,599 A | 10/1998 | Schacham-Diamond et al. |
| 5,840,625 A | 11/1998 | Feldner |
| 5,858,877 A | 1/1999 | Dennison et al. |
| 5,891,797 A | 4/1999 | Farrar |
| 5,891,804 A | 4/1999 | Havemann et al. |
| 5,893,752 A | 4/1999 | Zhang et al. |
| 5,895,740 A | 4/1999 | Chien et al. |
| 5,897,370 A | 4/1999 | Joshi et al. |
| 5,899,740 A | 5/1999 | Kwon |
| 5,907,772 A | 5/1999 | Iwasaki |
| 5,911,113 A | 6/1999 | Yao et al. |
| 5,913,147 A | 6/1999 | Dubin et al. |
| 5,925,930 A | 7/1999 | Farnworth et al. |
| 5,930,669 A | 7/1999 | Uzoh |
| 5,932,928 A | 8/1999 | Clampitt |
| 5,933,758 A | 8/1999 | Jain |
| 5,937,320 A | 8/1999 | Andricacos et al. |
| 5,939,771 A | 8/1999 | Usami |
| 5,940,733 A | 8/1999 | Beinglass et al. |
| 5,948,467 A | 9/1999 | Nguyen et al. |
| 5,962,923 A | 10/1999 | Xu et al. |
| 5,968,327 A | 10/1999 | Kobayashi et al. |
| 5,968,333 A | 10/1999 | Nogami et al. |
| 5,969,398 A | 10/1999 | Murakami |
| 5,969,422 A | 10/1999 | Ting et al. |
| 5,972,179 A | 10/1999 | Chittipeddi et al. |
| 5,972,804 A | 10/1999 | Tobin et al. |
| 5,976,710 A | 11/1999 | Sachdev et al. |
| 5,981,350 A | 11/1999 | Geusic et al. |
| 5,985,759 A | 11/1999 | Kim et al. |
| 5,985,762 A | 11/1999 | Geffken et al. |
| 5,989,623 A | 11/1999 | Chen et al. |
| 5,994,777 A | 11/1999 | Farrar |
| 6,001,730 A | 12/1999 | Farkas et al. |
| 6,001,736 A | 12/1999 | Kondo et al. |
| 6,002,175 A | 12/1999 | Maekawa |
| 6,004,884 A | 12/1999 | Abraham |
| 6,008,117 A | 12/1999 | Hong et al. |
| 6,015,465 A | 1/2000 | Kholodenko et al. |
| 6,016,000 A | 1/2000 | Moslehi |
| 6,017,820 A | 1/2000 | Ting et al. |
| 6,020,243 A | 2/2000 | Wallace et al. |
| 6,022,802 A | 2/2000 | Jang |
| 6,028,362 A | 2/2000 | Omura |
| 6,030,877 A | 2/2000 | Lee et al. |
| 6,030,895 A | 2/2000 | Joshi et al. |
| 6,037,248 A | 3/2000 | Ahn |
| 6,037,664 A | 3/2000 | Zhao et al. |
| 6,051,858 A | 4/2000 | Uchida et al. |
| 6,054,172 A | 4/2000 | Robinson et al. |
| 6,054,398 A | 4/2000 | Pramanick |
| 6,065,424 A | 5/2000 | Shacham-Diamand et al. |
| 6,069,068 A | 5/2000 | Rathore et al. |
| 6,071,810 A | 6/2000 | Wada et al. |
| 6,077,792 A | 6/2000 | Farrar |
| 6,090,697 A | 7/2000 | Xing et al. |
| 6,100,193 A | 8/2000 | Suehiro et al. |
| 6,103,320 A | 8/2000 | Matsumoto et al. |
| 6,107,186 A | 8/2000 | Erb |
| 6,117,781 A | 9/2000 | Lukanc et al. |
| 6,117,782 A | 9/2000 | Lukanc et al. |
| 6,120,641 A | 9/2000 | Stevens et al. |
| 6,121,149 A | 9/2000 | Lukanc et al. |
| 6,121,150 A | 9/2000 | Avanzino et al. |
| 6,126,989 A | 10/2000 | Robinson et al. |
| 6,130,161 A | 10/2000 | Ashley et al. |
| 6,136,095 A | 10/2000 | Xu et al. |
| 6,139,699 A | 10/2000 | Chiang et al. |
| 6,140,228 A | 10/2000 | Shan et al. |
| 6,140,234 A | 10/2000 | Uzoh et al. |
| 6,143,604 A | 11/2000 | Chiang et al. |
| 6,143,641 A | 11/2000 | Kitch |
| 6,143,646 A | 11/2000 | Wetzel |
| 6,143,650 A | 11/2000 | Pramanick et al. |

| | | | | | | |
|---|---|---|---|---|---|---|
| 6,143,655 | A | 11/2000 | Forbes et al. | 6,376,370 | B1 | 4/2002 | Farrar |
| 6,143,671 | A | 11/2000 | Sugai | 6,383,920 | B1 | 5/2002 | Wang et al. |
| 6,150,214 | A | 11/2000 | Kaeriyama | 6,387,542 | B1 | 5/2002 | Kozlov et al. |
| 6,150,261 | A | 11/2000 | Hsu et al. | 6,399,489 | B1 | 6/2002 | M'Saad et al. |
| 6,153,507 | A | 11/2000 | Mikagi | 6,403,481 | B1 | 6/2002 | Matsuda et al. |
| 6,159,769 | A | 12/2000 | Farnworth et al. | 6,410,418 | B1 | 6/2002 | Yang |
| 6,162,583 | A | 12/2000 | Yang et al. | 6,410,442 | B1 | 6/2002 | Yang |
| 6,168,704 | B1 | 1/2001 | Brown et al. | 6,417,094 | B1 | 7/2002 | Zhao et al. |
| 6,169,024 | B1 | 1/2001 | Hussein | 6,420,262 | B1 | 7/2002 | Farrar |
| 6,171,661 | B1 | 1/2001 | Zheng et al. | 6,420,702 | B1 | 7/2002 | Tripsas et al. |
| 6,174,800 | B1 | 1/2001 | Jang | 6,426,289 | B1 | 7/2002 | Farrar |
| 6,174,804 | B1 | 1/2001 | Hsu | 6,428,673 | B1 | 8/2002 | Ritzdorf et al. |
| 6,177,350 | B1 | 1/2001 | Sundarrajan et al. | 6,429,120 | B1 | 8/2002 | Ahn et al. |
| 6,181,012 | B1 | 1/2001 | Edelstein et al. | 6,448,331 | B1 * | 9/2002 | Ioka et al. .................... 524/859 |
| 6,183,564 | B1 | 2/2001 | Reynolds et al. | 6,486,533 | B2 * | 11/2002 | Krishnamoorthy et al. .. 257/586 |
| 6,184,121 | B1 | 2/2001 | Buchwalter et al. | 6,492,266 | B1 | 12/2002 | Ngo et al. |
| 6,187,248 | B1 * | 2/2001 | O'Neill et al. .............. 264/425 | 6,503,796 | B1 | 1/2003 | Tu |
| 6,187,656 | B1 | 2/2001 | Lu et al. | 6,508,920 | B1 | 1/2003 | Ritzdorf et al. |
| 6,190,732 | B1 | 2/2001 | Omstead et al. | 6,515,323 | B1 | 2/2003 | Jung et al. |
| 6,194,317 | B1 | 2/2001 | Kaisaki et al. | 6,518,173 | B1 | 2/2003 | Chan |
| 6,197,181 | B1 | 3/2001 | Chen | 6,518,198 | B1 | 2/2003 | Klein |
| 6,197,688 | B1 | 3/2001 | Simpson | 6,552,432 | B2 | 4/2003 | Farrar |
| 6,204,096 | B1 | 3/2001 | Lai et al. | 6,562,416 | B2 | 5/2003 | Ngo et al. |
| 6,207,222 | B1 * | 3/2001 | Chen et al. .................. 205/123 | 6,565,729 | B2 | 5/2003 | Chen et al. |
| 6,207,553 | B1 | 3/2001 | Buynoski et al. | 6,573,182 | B2 | 6/2003 | Sandhu et al. |
| 6,207,558 | B1 | 3/2001 | Singhvi et al. | 6,576,982 | B1 | 6/2003 | You et al. |
| 6,208,016 | B1 | 3/2001 | Farrar | 6,589,863 | B1 | 7/2003 | Usami |
| 6,211,049 | B1 | 4/2001 | Farrar | 6,614,099 | B2 | 9/2003 | Farrar |
| 6,211,071 | B1 | 4/2001 | Lukanc et al. | 6,632,345 | B1 | 10/2003 | Chen |
| 6,211,073 | B1 | 4/2001 | Ahn | 6,638,410 | B2 | 10/2003 | Chen et al. |
| 6,211,090 | B1 | 4/2001 | Durlam et al. | 6,646,347 | B2 | 11/2003 | Mercado et al. |
| 6,215,186 | B1 | 4/2001 | Konecni et al. | 6,664,197 | B2 | 12/2003 | Stevens et al. |
| 6,221,763 | B1 | 4/2001 | Gilton | 6,674,169 | B2 | 1/2004 | Sandhu et al. |
| 6,224,690 | B1 | 5/2001 | Andricacos et al. | 6,686,270 | B1 | 2/2004 | Subramanian et al. |
| 6,228,754 | B1 | 5/2001 | Iacoponi et al. | 6,709,919 | B2 | 3/2004 | Tu |
| 6,232,219 | B1 | 5/2001 | Blalock et al. | 6,710,447 | B1 | 3/2004 | Nogami |
| 6,232,230 | B1 | 5/2001 | Iacoponi | 6,737,725 | B2 | 5/2004 | Grill et al. |
| 6,239,017 | B1 | 5/2001 | Lou et al. | 6,740,392 | B1 | 5/2004 | Farrar |
| 6,245,662 | B1 | 6/2001 | Naik et al. | 6,743,716 | B2 | 6/2004 | Farrar |
| 6,249,056 | B1 | 6/2001 | Kwon et al. | 6,756,298 | B2 | 6/2004 | Ahn et al. |
| 6,251,781 | B1 | 6/2001 | Zhou et al. | 6,803,309 | B2 | 10/2004 | Chou et al. |
| 6,255,217 | B1 | 7/2001 | Agnello et al. | 6,833,289 | B2 | 12/2004 | Hu et al. |
| 6,258,707 | B1 | 7/2001 | Uzoh | 6,846,756 | B2 | 1/2005 | Pan et al. |
| 6,261,946 | B1 | 7/2001 | Iacoponi et al. | 6,888,246 | B2 | 5/2005 | Mercado et al. |
| 6,262,376 | B1 | 7/2001 | Hurwitz et al. | 7,105,914 | B2 | 9/2006 | Farrar |
| 6,265,301 | B1 | 7/2001 | Lee et al. | 7,211,512 | B1 | 5/2007 | Ahn et al. |
| 6,265,311 | B1 | 7/2001 | Hautala et al. | 7,220,665 | B2 | 5/2007 | Farrar |
| 6,271,592 | B1 | 8/2001 | Kim et al. | 7,253,521 | B2 | 8/2007 | Ahn et al. |
| 6,277,263 | B1 | 8/2001 | Chen | 7,262,130 | B1 | 8/2007 | Ahn et al. |
| 6,280,640 | B1 | 8/2001 | Hurwitz et al. | 7,262,505 | B2 | 8/2007 | Ahn et al. |
| 6,284,656 | B1 | 9/2001 | Farrar | 7,285,196 | B2 | 10/2007 | Ahn et al. |
| 6,287,954 | B1 | 9/2001 | Ashley et al. | 7,301,190 | B2 | 11/2007 | Farrar |
| 6,288,442 | B1 | 9/2001 | Farrar | 7,368,378 | B2 | 5/2008 | Ahn et al. |
| 6,288,447 | B1 | 9/2001 | Amishiro et al. | 7,378,737 | B2 | 5/2008 | Farrar |
| 6,288,448 | B1 | 9/2001 | Pramanick | 7,394,157 | B2 | 7/2008 | Farrar |
| 6,290,833 | B1 | 9/2001 | Chen | 7,402,516 | B2 | 7/2008 | Ahn et al. |
| 6,303,498 | B1 | 10/2001 | Chen et al. | 2001/0002333 | A1 | 5/2001 | Huang et al. |
| 6,313,035 | B1 | 11/2001 | Sandhu et al. | 2002/0014646 | A1 | 2/2002 | Tsu et al. |
| 6,319,834 | B1 | 11/2001 | Erb et al. | 2002/0028552 | A1 | 3/2002 | Lee et al. |
| 6,323,553 | B1 | 11/2001 | Hsu et al. | 2002/0096768 | A1 | 7/2002 | Joshi |
| 6,326,303 | B1 | 12/2001 | Robinson et al. | 2002/0109233 | A1 | 8/2002 | Farrar |
| 6,333,255 | B1 | 12/2001 | Sekiguchi | 2002/0115292 | A1 | 8/2002 | Andricacos et al. |
| 6,342,448 | B1 | 1/2002 | Lin et al. | 2002/0167089 | A1 | 11/2002 | Ahn et al. |
| 6,350,678 | B1 | 2/2002 | Pramanick et al. | 2002/0177302 | A1 | 11/2002 | Farrar |
| 6,350,687 | B1 | 2/2002 | Avanzino et al. | 2002/0182859 | A1 | 12/2002 | Farrar |
| 6,358,849 | B1 | 3/2002 | Havemann et al. | 2003/0034560 | A1 | 2/2003 | Matsuse et al. |
| 6,359,328 | B1 * | 3/2002 | Dubin ........................ 257/622 | 2004/0161924 | A1 | 8/2004 | Chen et al. |
| 6,361,667 | B1 | 3/2002 | Kobayashi et al. | 2004/0206308 | A1 | 10/2004 | Ahn et al. |
| 6,365,511 | B1 | 4/2002 | Kizilyalli et al. | 2005/0023697 | A1 | 2/2005 | Ahn et al. |
| 6,368,965 | B1 | 4/2002 | Lopatin | 2005/0023699 | A1 | 2/2005 | Ahn et al. |
| 6,368,966 | B1 | 4/2002 | Krishnamoorthy et al. | 2005/0032352 | A1 | 2/2005 | Farrar |
| 6,372,622 | B1 | 4/2002 | Tan et al. | 2006/0006548 | A1 | 1/2006 | Farrar |
| 6,376,368 | B1 | 4/2002 | Jung et al. | 2006/0246733 | A1 | 11/2006 | Ahn et al. |

| 2006/0292857 A1 | 12/2006 | Ahn et al. |
| 2007/0085213 A1 | 4/2007 | Ahn et al. |
| 2007/0141830 A1 | 6/2007 | Ahn et al. |
| 2007/0167005 A1 | 7/2007 | Ahn et al. |

FOREIGN PATENT DOCUMENTS

| EP | 0808915 A2 | 11/1997 |
| JP | 5-267643 | 10/1993 |
| JP | 05-295533 | 11/1993 |
| JP | 05160826 | 3/1995 |
| JP | 07078815 | 3/1995 |
| JP | 07-321111 | 8/1995 |

OTHER PUBLICATIONS

"Brooks Model 5964 High Performance Metal Seal Mass Flow Controller (Introduced in 1991)", *Brooks Instrument*, http://www.frco.com/brooks/semiconductor/products1i.html,(1991),1 page.

"Improved Metallurgy for Wiring Very Large Scale Integrated Circuits", *International Technology Disclosures*, 4, Abstract,(1986),1 page.

Abe, K., et al., "Sub-half Micron Copper Interconnects Using Reflow of Sputtered Copper Films", *VLSI Multilevel Interconnection Conference*, (Jun. 25-27, 1995),308-311.

American Society for Metals, "Metals Handbook", *Properties and Selection: Nonferrous Alloys and Pure Metals, Ninth Edition*, vol. 2, Metals Park, Ohio : American Society for Metals,(1989),157, 395.

Andricacos, P. C., "Copper On-Chip Interconnections", *The Electrochemical Society Interface*, (1999),32-37.

Anonymous, "Formation of Conductors at Variable Depths—Using Differential Photomask, Projecting Images into Insulator by Reactive Ion Etching, Selectively Filling Images with Conductor", *Research Disclosure*, Disclosure No. RD 291015, Abstract,(Jul. 10, 1988),1 page.

Bae, Sanghoon , et al., "Low-Temperature Deposition Pathways to Silicon Nitride, Amorphous Silicon, Polycrystalline Silicon, and n type Amorphous Silicon Films Using a High Density Plasma System", *IEEE Conference Record—Abstracts, International Conference on Plasma Science*, (1997),315.

Bai, G. , "Copper Interconnection Deposition Techniques and Integration", *1996 Symposium on VLSI Technology*, Digest of Technical Papers,(1996),48-49.

Bernier, M. , et al., "Laser processing of palladium for selective electroless copper plating", *SPIE*, 2045, (1994),330-337.

Bhansali, S. , et al., "A novel technique for fabrication of metallic structures on polymide by selective electroless copper plating using ion implantation", *Thin Solid Films*, 270, No. 1/02, (1995),489-492.

Bhansali, S. , et al., "Selective electroless copper plating on silicon seeded by copper ion implantation", *Thin Solid Films*, 253, (1994),391-394.

Braud, F. , "Ultra Thin Diffusion Barriers for Cu Interconnections at The Gigabit Generation and Beyond", *VMIC Conference Proceedings*, (1996),174-179.

Cabrera, A. L., et al., "Oxidation protection for a variety of transition metals and copper via surface silicides formed with silane containing atmospheres", *Journal of Materials Research*, 6(1),71-79.

Chakravorty, K. K., et al., "High-Density Interconnection Using Photosensitive Polyimide and Electroplated Copper Conductor Lines", *IEEE Transactions on Components, Hybrids, and Manufacturing Technology*, 13(1), (Mar. 1990),200-206.

Craig, J. D., "Polymide Coatings", *Packaging, Electronic Materials Handbook*, vol. 1, ASM International Handbook Committee (eds.), ASM International, Materials Park, OH,(1989),767-772.

De Felipe, T. S., et al., "Electrical Stability and Microstructural Evolution in Thin Films of High Conductivity Copper Alloys", *Interconnect Technology, 1999, IEEE International Conference*, (May 24-26, 1999),293-295.

Ding, "Copper Barrier, Seed Layer and Planarization Technologies", *VMIC Conference Proceedings*, (1997),87-92.

Dubin, V. M., et al., "Selective and Blanket Electroless Copper Deposition for Ultralarge Scale Integration", *Journal of the Electrochemical Society*, 144(3), (1997),898-908.

Dushman, S., et al., *Scientific Foundations of Vacuum Technique, 2nd Edition*, John Wiley and Sons,(1962),1-806.

Edelstein, D. , "Full Copper Wiring in a Sub-0.25 micrometer CMOS ULSI Technology", *Technical Digest., International Electron Devices Meeting*, (Dec. 7-10, 1997),773-776.

Eisenbraun, E. T., et al., "Selective and Blanket Low-Temperature Copper CVD for Multilevel Metallization in ULSI", *Conference Proceedings ULSI-VII*, (1992),5 pages.

Eldridge, J. M., "New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics*, Mpls, MN,(1987),283-285.

Ernst, et al., "Growth Model for Metal Films on Oxide Surface: Cu on ZnO(0001)-O", *Physical Review B*, 47, (May 15, 1993),13782-13796.

Fukuda, T. , et al., "0.5 -micrometer-Pitch Copper-Dual-Damascene Metallization Using Organic SOG (k=2.9) for 0.18-micrometer CMOS Applications", *Electron Devices Meeting, 1999. IEDM Technical Digest. International*, (1999),619-622.

Gladfelter, W. L., et al., "Trimethylamine Complexes of Alane as Precursors for the Low-Pressure Chemical Vapor Deposition of Aluminum", *Chemistry of Materials*, 1. (1989),pp. 339-343.

Godbey, D. J., et al., "Copper Diffusion in Organic Polymer Resists and Inter-level Dielectrics", *Thin Solid Films*, 308-309, (1997),pp. 470-474.

Grimlot, J. , et al., "II. Oxidation of Aluminum Films", *Journal of the Electrochemical Society*, 129(10), (1982),2369-2372.

Hattangady, S. V., et al., "Integrated processing of silicon oxynitride films by combined plasma and rapid-thermal processing", *J. Vac. Sci. Technol. A*, 14(6), (1996),pp. 3017-3023.

Hirao, S. , et al., "A Novel Copper Reflow Process Using Dual Wetting Layers", *Symposium on VLSI Technology*, Digest of Technical Papers,(1997),57-58.

Hirao, S. , et al., "A Novel Copper Reflow Process Using Dual Wetting Layers", *1997 Symposium on VLSI Technology*, Digest of Technical Papers,(1997),57-58.

Hirata, A. , et al., "WSiN Diffusion Barrier Formed by ECR Plasma Nitridation for Copper Damascene Interconnection", *16th Solid State Devices and Materials*, (1998),pp. 260-261.

Holloway, Karen , et al., "Tantalum as a diffusion barrier between copper and silicon", *Applied Physics Letters*, 57(17), (Oct. 1990),1736-1738.

Hu, C. K., et al., "Extendibility of Cu Damascene to 0.1 micrometer Wide Interconnections", *Mat. Res. Soc. Symp. Proc*, 514. (1998),287-292.

Hymes, S. , et al., "Passivation of Copper by Silicide Formation in Dilute Silane", *Conference Proceedings ULSI-VII*, (1992),425-431.

Iijima, T. , "Microstructure and Electrical Properties of Amorphous W-Si-N Barrier Layer for Cu Interconnections", *1996 VMIC Conference*, (1996),168-173.

Izaki, M. , et al., "Characterization of Transparent Zinc Oxide Films Prepared by Electrochemical Reaction", *Journal of the Electrochemical Society*, 144, (Jun. 1997),1949-1952.

Jayaraj, K. , "Low Dielectric Constant Microcellular Foams", *Proceedings from the Seventh Meeting of the DuPont Symposium on Polymides in Microelectrics*, (Sep. 1996),474-501.

Jeon, Y. , et al., "Low-Temperature Fabrication of Polycrystalline Silicon Thin Films by ECR Pecvd", *The Electrochemical Society Proceedings*, 94(35), (1995),103-114.

Jin, C. , et al., "Porous Xerogel Films as Ultra-low Permittivity Dielectrics for ULSI Interconnect Applications", *Conference Proceedings ULSI XII—1997 Materials Research Society*, (1997),463-469.

Kaloyeros, A. E., et al., "Blanket and Selective Copper CVD from Cu(FOD)2 for Multilivel Metallization", *Mat. Res. Soc. Symp. Proc.*, vol. 181,(1990),6 pages.

Kamins, T. I., "Structure and Properties of LPCVD Silicon Films", *J. Electrochem. Soc.: Solid-State Science and Technology*, 127, (Mar. 1980),pp. 686-690.

Kang, H. K., et al., "Gain Structure and Electromigration Properties of CVD CU Metallization", *Proceedings of the 10th International VLSI Multilevel Interconnection Conference*, (Jun. 8-9, 1993),223-229.

Keppner, H., et al., "The "Micromorph" Cell: A New Way to High-Efficiency-Low-Temperature Crystalline Silicon Thin-Film Cell Manufacturing", *Mat. Res. Soc. Symp. Proc.*, 452, (1997),pp. 865-876.

Kiang, M., et al., "Pd/Si plasma immersion ion implantation for selective electroless copper plating on SiO2", *Applied Physics Letters*, 60(22), (Jun. 1, 1992),2767-2769.

Kirk, Raymond E., *Kirk-Othmer Concise Encyclopedia of Chemical Technology*, Grayson, M., (ed.), John Wiley & Sons, Inc., New York, NY,(1985),433-435, 926-938.

Kistiakowsky, G. B., et al., "Reactions of Nitrogen Atoms. I. Oxygen and Oxides of Nitrogen", *The Journal of Chemical Physics*, 27(5), (1957),pp. 1141-1149.

Klaus, J W., "Atomic layer deposition of tungsten nitride films using sequential surface reactions", *Journal of the Electrochemical Society*, vol. 147, No. 3, (Mar. 2000),1175-1181.

Laursen, T., "Encapsulation of Copper by Nitridation of Cu-Ti Alloy/ Bilayer Structures", *International Conference on Metallurgical Coatings and Thin Films*, Abstract No. H1.03, San Diego, CA,(Apr. 1997),309.

Len, V., et al., "An investigation into the performance of diffusion barrier materials against copper diffusion using metal-oxide-semiconductor (MOS) capacitor structures", *Solid-State Electronics*, 43, (1999),pp. 1045-1049.

Lyman, T., et al., "Metallography, Structures and Phase Diagrams", *Metals Handbook*, 8, American Society for Metals, Metals Park, Ohio,(1989),pp. 300 & 302.

Marcadal, C., "OMCVD Copper Process for Dual Damascene Metallization", *VMIC Conference*, ISMIC,(1997),93-97.

Miller, R. D., "Low Dielectric Constant Polyimides and Polyimide Nanofoams", *Seventh Meeting of the DuPont Symposium on Polymides in Microelectronics*, (Sep. 1996),443-473.

Min, Jae-Sik, et al., "Metal-Organic Atomic-Layer Deposition of Titanium-Silicon-Nitride Films", *Applied Physics Letters*, 75(11), (Sep. 13, 1999),1521-1523.

Min, J., "Metal-organic atomic-layer deposition of titanium-silicon-nitride films", *Applied Physics Letters*, 75(11), (1999),1521-1523.

Miyake, T., et al., "Atomic Hydrogen Enhanced Reflow of Copper", *Applied Physics Letters*, 70(10), (1997),1239-1241.

Murarka, S. P., et al., "Copper Interconnection Schemes: Elimination of The Need of Diffusion Barrier/Adhesion Promoter by the Use of Corrosion Resistant, Low Resistivity Doped Copper", *SPIE*, 2335, (1994),pp. 80-90.

Murarka, S. P., et al., "Copper Metallization for ULSI and Beyond", *Critical Reviews in Solid State and Materials Sciences*, 20(2), (1995),87-124.

Nakao, S., et al., "Thin and Low-Resistivity Tantalum Nitride Diffusion Barrier and Giant-Grain Copper Interconnects for Advanced ULSI Metallization", *Japanese Journal of Applied Physics*, 38(4B), (Apr. 1999),pp. 262-263.

Nayak, D. K., "High performance GeSi quantum-well PMOS on SIMOX", *International Electron Devices Meeting* 1992. *Technical Digest*. (1992),777-780.

Newboe, B., et al., "Applied Materials Announces First Barrier/Seed Layer System For Copper Interconnects", *Applied Materials*, http://www.appliedmaterials.com/newsroom/pr-00103.html,(1997),pp. 1-4.

Okamoto, Y., et al., "Magnetically Excited Plasma Oxynitridation of Si at Room Temperature",*Japanese Journal of Applied Physics*, 34, (1995),L955-957.

Palleau, J., et al., "Refractory Metal Encapsulation in Copper Wiring", *Advanced Metallization for Devices and Circuits-Science, Technology and Manufacturability, Materials Research Society Symposium Proceedings*, 337, (Apr. 1994),225-231.

Park, C. W., et al., "Activation Energy for Electromigration in Cu Films", *Applied Physics Letters*, 59(2), (Jul. 6, 1991),175-177.

Radzimski, Z. J., et al., "Directional Copper Deposition using d-c Magnetron Self-sputtering", *J. Vac. Sci. Technol. B*, 16(3), (1998),pp. 1102-1106.

Ramos, T., et al., "Nanoporous Silica for Dielectric Constant Less Than 2", *Conference Proceedings ULSI XII—1997 Materials Research Society*, (1997),455-461.

Rath, J. K., et al., "Low-Temperature deposition of polycrystalline silicon thin films by hot-wire CVD", *Solar Energy Materials and Solar Cells*, 48, (1997),pp. 269-277.

Ray, S. K., et al., "Fluorine-enhanced nitridation of silicon at low temperatures in a microwave plasma", *J. Appl. Phys.*, 70(3), (1991),pp. 1874-1876.

Rossnagel, S. M., "Magnetron Sputter Deposition of Interconnect Applications", *Conference Proceedings, ULSI XI*, (1996),227-232.

Rossnagel, S. M., et al., "Metal ion deposition from ionized mangetron sputtering discharge", *J. Vac. Sci. Technol. B*, 12(1), (1994),pp. 449-453.

Ryan, J. G., "Copper Interconnects for Advanced Logic and DRAM", Extended Abstracts of the 1998 International Conference on Solid-State Devices and Materials, Hiroshima,(1998),pp. 258-259.

Ryu, Changsup, "Barriers for Copper Interconnections", *Solid State Technology*, 42(4), (Apr. 1999),pp. 1-3.

Ryu, C., et al., "Barriers for copper interconnections", *Solid State Technology*, (Apr. 1999),pp. 53,54,56.

Saarivirta, M. J., "High Conductivity Copper Rich Cu-Zr Alloys", *Transactions of the Metallurgical Society of AIME*, 218 (1960),431-437.

Senzaki, Y., "Chemical Vapor Deposition of Copper using a New Liquid Precursor with Improved Thermal Stability", *Conference Proceedings ULSI XIII, Materials Research Society*,(1998),pp. 451-455.

Shacham-Diamand, Y., "100 nm Wide Copper Lines Made by Selective Electroless Deposition", *Journal of Micromechanics and Microengineering*, 1. (Mar. 1991),66-72.

Shacham-Diamand, Yosi, et al., "Copper electroless deposition technology for ultra-large-scale-intergration (ULSI) metallization", *Microelectronic Engineering*, NL, vol. 33, No. 1, XP004054497, (1997),47-58.

Srivatsa, A. R., et al., "Jet Vapor Deposition: an Alternative to Electrodeposition", *Surface Engineering*, 11, (1995),75-77.

Stroud, P. T., et al., "Preferential deposition of silver induced by low energy gold ion implantation", *Thin Solid Films*, Switzerland, vol. 9, No. 2, XP000993098, (Feb. 1972),273-281.

Tao, J., et al., "Electromigration Characteristics of Copper Interconnects", *IEEE Electron Devices Letters*, 14(5), (May 1993),249-251.

Ting, C. H., "Methods and Needs for Low K Material Research", *Materials Research Society Symposium Proceedings*, vol. 381, Low-Dielectric Constant Materials—Synthesis and Applications in Microelectronics, Lu, T.M., et al., (eds.), San Francisco, CA,(Apr. 17-19, 1995),3-17.

Tsukada, T., et al., "Adhesion of copper films on ABS polymers deposited in an internal magnet magnetron sputtering system",*J. Vac. Sci. Technol.*, 16(2), (1979),348-351.

Van Vlack, Lawrence H., "Elements of Materials Science", *Addison-Wesley Publishing Co., Inc.* Reading, MA, (1959),468.

Venkatesan, S., et al., "A High Performance 1.8V, 0.20 micrometer CMOS Technology with Copper Metalization", *Electron Devices Meeting*, 1997. *Technical Digest., International*, (Dec. 7-10, 1997),769-772.

Venkatesan, S., "A High Performance 1.8V, 0.20 micrometer CMOS Technology with Copper Metallization", *IEEE*, (1997),pp. 769-772.

Vossen, J. L., et al., *Thin Film Processes II*, Academic Press, Inc. ,(1991),1-866.

Wang, X. W., et al., "Highly Reliable Silicon Nitride Thin Films Made by Jet Vapor Deposition", *Japanese Journal of Applied Physics*, vol. 34, Part1, No. 2B, (Feb. 1995),955-958.

Wang, K., et al., "Very Low Temperature Deposition of Polycrystalline Silicon Films with Micro-Meter-Order Grains on SiO2", *Mat. Res. Soc. Symp. Proc.*, 355, (1995),pp. 581-586.

Winters, H. F., et al., "Influence of Surface Absorption Characteristics on Reactivity Sputtered Films Grown in the Biased and Unbiased Modes", *J. Appl. Phys.*, 43(3), (1972),pp. 794-799.

Wolf, S., et al., *Silicon Processing for the VLSI Era*, vol. 1—*Process Technology*, Lattice Press, Sunset Beach, CA,(1986),514-538.

Yeh, J. L., et al., "Selective Copper plating of Polysilicon Surface Micromachined Structures", *Solid-State Sensor and Actuator Workshop*, (1998),pp. 248-251.

Zhang, J., et al., "Investigations of photo-induced decomposition of palladium acetate for electroless copper plating", *Thin Solid Films*, 318, (1998),pp. 234-238.

US 7,078,338, 07/2006, Ahn et al. (withdrawn)

\* cited by examiner

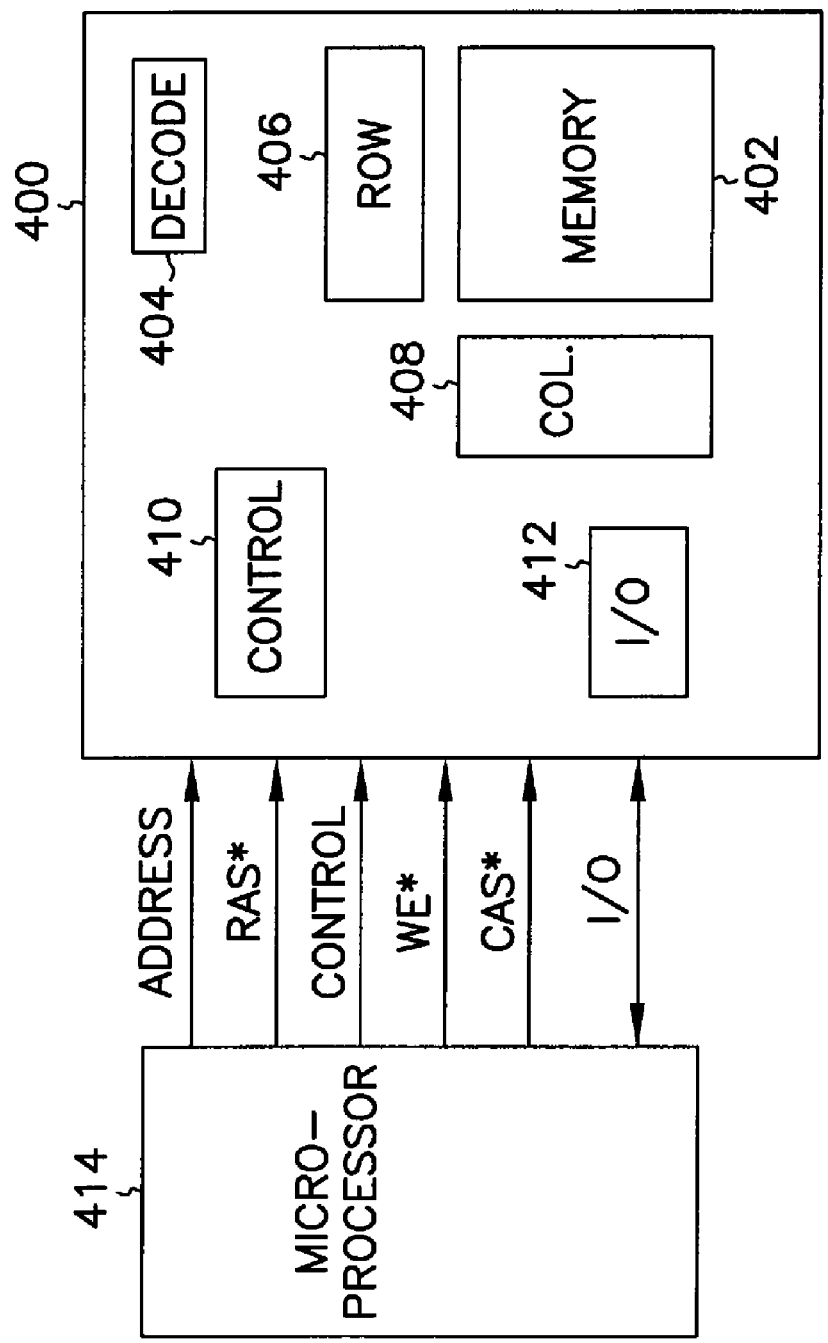

STRUCTURES AND METHODS TO ENHANCE COPPER METALLIZATION

This application is a Divisional of U.S. application Ser. No. 10/854,552, filed May 26, 2004, which is a Divisional of U.S. application Ser. No. 10/196,081, filed Jul. 16, 2002, now U.S. Pat. No. 7,378,737 which is a Divisional of U.S. application Ser. No. 09/483,869, filed Jan. 18, 2000, now U.S. Pat. No. 6,420,262, all of which are incorporated herein by reference.

RELATED APPLICATIONS

This application is related to the following commonly assigned applications: U.S. application Ser. No. 09/483,881 filed Jan. 18, 2000; U.S. application Ser. No. 09/484,002 filed Jan. 18, 2000, now U.S. Pat. No. 6,376,370; U.S. application Ser. No. 09/488,098 filed Jan. 18, 2000, now U.S. Pat. No. 6,429,120; U.S. application Ser. No. 09/484,303 filed Jan. 18, 2000, all of which are incorporated herein by reference.

TECHNICAL FIELD

The technical field relates generally to semiconductor structures. More particularly, it pertains to metallization layers in semiconductor structures.

BACKGROUND

One of the main issues confronting the semiconductor processing industry is that of the capacitive-resistance problem in metallization layers. An industry-wide effort has undertaken to address the problem. Since the beginning, the semiconductor processing industry has relied on aluminum and aluminum alloys to serve as metallization layers. Silicon dioxide was selected as the insulator of choice although polyimide, a polymer, was used in a number of products by IBM for a number of years. With each succeeding generation of technology, the capacitive-resistance problem grows. Because each generation requires that the dimensions of the semiconductor structure be reduced, the minimum line-space combination must also decrease. As the line-space combination decreases, the capacitance and resistance of the semiconductor structure increases. Thus, these increases contribute to the problem.

Copper metallurgy has been proposed as a substitute for aluminum metallurgy as a material for the metallization layers since copper exhibits greater conductivity than aluminum. Yet several problems have been encountered in the development of copper metallurgy. The main issue is the fast diffusion of copper through an insulator, such as silicon dioxide, to form an undesired copper oxide compound. Another issue is the known junction-poisoning effect of copper. These issues have led to the development of a liner to separate the copper metallization layer from the insulator. The use of titanium nitride as a liner was proposed by C. Marcadal et al., "OMCVD Copper Process for Dual Damascene Metallization," VMIC Conference Proceedings, p. 93-7 (1997). The use of tantalum nitride as a liner was proposed by Peijun Ding et al., "Copper Barrier, Seed Layer and Planarization Technologies," VMIC Conference Proceedings, p. 87-92 (1997). The use of titanium as a liner was proposed by F. Braud et al., "Ultra Thin Diffusion Barriers for Cu Interconnections at the Gigabit Generation and Beyond," VMIC Conference Proceedings, p. 174-9 (1996). The use of tungsten silicon nitride as a liner was proposed by T. Iijima et al., "Microstructure and Electrical Properties of Amorphous W—Si—N Barrier Layer for Cu Interconnections," VMIC Conference Proceedings, p. 168-73 (1996). The use of zirconium, hafnium, or titanium as a liner was proposed by Anonymous, "Improved Metallurgy for Wiring Very Large Scale Integrated Circuits," International Technology Disclosures, v. 4 no. 9, (Sep. 25, 1996). The use of titanium as a liner was proposed by T. Laursen, "Encapsulation of Copper by Nitridation of Cu—Ti Alloy/Bilayer Structures," International Conference on Metallurgical Coatings and Thin Films in San Diego, Calif., paper H1.03 p. 309 (1997). The use of tantalum, tungsten, tantalum nitride, or trisilicon tetranitride as a liner is currently favored by the industry. See Changsup Ryu et al., "Barriers for Copper Interconnections," Solid State Technology, p. 53-5 (1999).

Yet another solution to the problem of fast diffusion of copper through an insulator was proposed by researchers at Rensselaer Polytechnic Institute (hereinafter, RPI). See S. P. Muraka et al., "Copper Interconnection Schemes: Elimination of the Need of Diffusion Barrier/Adhesion Promoter by the Use of Corrosion Resistant, Low Resistivity Doped Copper," SPIE, v. 2335, p. 80-90 (1994) (hereinafter, Muraka); see also Tarek Suwwan de Felipe et al., "Electrical Stability and Microstructural Evolution in Thin Films of High Conductivity Copper Alloys," Proceedings of the 1999 International Interconnect Technology Conference, p. 293-5 (1999). These researchers proposed to alloy copper with a secondary element, which is either aluminum or magnesium. In their experiments, they used copper alloys with at least 0.5 atomic percent aluminum or 2 atomic percent magnesium. When the copper alloy is brought near the insulator, silicon dioxide, the secondary element and silicon dioxide form dialuminum trioxide or magnesium oxide. The formed dialuminum trioxide or magnesium oxide acts as a barrier to the fast diffusion of copper into the silicon dioxide.

Along the same technique as proposed by RPI, Harper et al. discuss in U.S. Pat. No. 5,130,274 (hereinafter, IBM) the use of a copper alloy containing either aluminum or chromium as the secondary element. As above, the secondary element with the insulator, such as silicon dioxide or polyimide, forms a barrier to the fast diffusion of copper.

Semiconductor products with some of the discussed solutions to the fast diffusion of copper have begun to ship, on a limited basis, and yet the problem of reducing the resistivity in ever smaller line dimensions is still present. It has been shown by Panos C. Andricacos, "Copper On-Chip Interconnections," The Electrochemical Society Interface, pg. 32-7 (Spring 1999) (hereinafter Andricacos), that the effective resistivity obtainable by the use of barrier layers was approximately 2 microhm-centimeters with a line width greater than 0.3 micrometer. The effective resistivity undesirably increases for lines narrower than that. The alloy approach investigated by RPI had similar resistivity values as found by Andricacos. RPI also found that the use of 0.5 atomic percent aluminum, in the copper, was apparently insufficient to give complete protection from copper diffusion into the silicon dioxide although a significant reduction in the rate of copper penetration through the silicon dioxide was achieved. It should be noted that the maximum solubility of aluminum in copper is 9.2 weight percent or approximately 18 atomic percent whereas the maximum solubility of magnesium in copper is 0.61 weight percent or approximately 0.3 atomic percent. Thus, the alloys used by RPI were saturated with magnesium but far below the saturation limit when aluminum was used as the secondary element in the alloy.

Other researchers have focused on the capacitive effect. The capacitive effect has been studied with respect to polymers, such as polyimide, which are used to substitute for silicon dioxide as insulation in semiconductor structures. Some of these polymers have dielectric constants that are considerably lower than silicon dioxide, and a presumption can be made that the use of these polymers should lessen the undesired capacitive effect. Yet, when one of these polymers is cured to form an insulator near the vicinity of the copper metallization layer, the polymer reacts with the copper metallization layer to form copper dioxide, a conductive material. See D. J. Godbey et al., "Copper Diffusion in Organic Polymer Resists and Inter-Level Dielectrics," Thin Solid Films, v. 308-9, p. 470-4 (1970) (hereinafter, Godbey). This conductive material is dispersed within the polymer thereby effectively raising the dielectric constant of the polymer and in many cases even increasing its conductivity. Hence, the undesired capacitive effect continues even with the use of lower dielectric polymer materials.

Andricacos points out that the use of copper along with cladding offers a significant improvement in conductivity over the titanium/aluminum-copper alloy/titanium sandwich structure now in widespread use throughout the industry. Andricacos also noted that as the line width decreases even a thin liner would undesirably effect the line resistance. The proposals by RPI and IBM attempt to address this problem by forming the liner using a copper alloy. The liner formed using a copper alloy displaces a portion of an area that was occupied by the insulator.

However, in solving one problem, RPI and IBM introduce another problem. The copper alloys used by RPI and IBM essentially lack the desirable properties of copper that initially drove the industry to use it. As was pointed out by RPI, the use of an alloy containing aluminum, even at a concentration so low as to not be completely effective in preventing the diffusion of copper, shows a measurable increase in resistance. IBM used only one layer of the alloy. Yet, that one layer has a high concentration of aluminum and will undoubtedly have an undesired effect on the resistivity.

As the minimum dimensions shrink, the use of even a twenty-Angstrom layer of an alloy with higher resistivity will have a significant effect on the total resistivity of the conductor composite. For example, a 200-Angstrom film on both sides of a 0.1 micron trench is 40 percent of the total trench width. Therefore, at the same time that the dimensions of the metallization layer decrease, the specific resistivity undesirably increases.

It has also been shown that there is a significant difference between the amount of the undesired copper oxide compound that is formed when a polyimide insulator is used if the acidity of the polymer solution is low. This is the case if the precursor used in the formation of the polyimide is an ester instead of acid. In the case of PI-2701, which is a photosensitive polyimide that starts from an ester precursor, the amount of oxide formed is reduced by a factor of approximately four as compared to films with a similar final chemistry. See Godbey. It is thought that the slight acidity of PI-2701 may come from the photo-pac or the process used to form it. The films in the study by Godbey were all prepared by curing the liquid precursor in air or in an approximately inert environment. It is also well known that copper oxide will not form in and can be reduced by a high purity hydrogen atmosphere.

Muraka opines that the use of titanium as a barrier layer was found to increase the resistivity of the copper film significantly when heat-treated at temperatures of 350 degrees Celsius or above. If the heat-treatment was carried out in hydrogen, no increase in resistivity was reported. As this temperature is above the eutectoid temperature of the titanium-hydrogen system, the formation of titanium hydride is assumed to have occurred. Muraka also asserts that a similar increase in resistivity is seen with zirconium and hafnium containing copper alloys, yet Muraka provides no data to support the assertion.

Other research results weaken the conclusion of Muraka. See Saarivirta 1; see also U.S. Pat. No. 2,842,438 to Matti J. Saarivirta and Alfred E. Beck (Jul. 8, 1958). If one looks at the equilibrium phase diagrams of the copper-titanium and copper-zirconium systems, it can be seen that the solubility of zirconium in copper is more than ten times less than that of titanium. See Metals Handbook, v. 8, p. 300-2 ($8^{th}$ Ed.). It should also be noted that a series of copper-zirconium alloys have been disclosed that have quite good electrical conductivity.

It has been shown that alloys containing more than about 0.01 weight percent zirconium have a significant loss of conductivity in the as-cast state. See Matti J. Saarivirta, "High Conductivity Copper-Rich Cu—Zr Alloys," Trans. of The Metallurgical Soc. of AIME, v. 218, p. 431-7 (1960) (hereinafter, Saarivirta 1). It has also been shown that the conductivity of even a 0.23 weight percent zirconium alloy is restored to above 90 percent of IACS when the alloy, in the cold drawn state, is heat-treated above 500 degrees Celsius for one hour. This shows that a significant amount of the zirconium, which was in solid solution in the as-cast state, has precipitated as pentacopper zirconium. From this data, it can be seen that if the zirconium content in the copper is kept low the conductivity of the resulting metallurgy can be above 95 percent of IACS. If it is desired to deposit a zirconium layer on top of a copper layer the temperature of deposition of the zirconium should be kept below 450 degrees Celsius, such as between 250 degrees Celsius and 350 degrees Celsius. Such deposition may occur in a single damascene process or at the bottom of vias in a dual-damascene process. The term "vias" means the inclusion of contact holes and contact plugs. When the deposition temperature is kept in this range, a thin layer of pentacopper zirconium tends to form initially thus inhibiting the diffusion of zirconium into the copper. While even at 450 degrees Celsius the solubility is low enough to give very good conductivity, and although zirconium and titanium have many properties that are very similar, their solubility in copper differs by more than a factor of ten. Therefore, the use of zirconium is much preferred over titanium for this application.

What has been shown is the need of the semiconductor processing industry to address the issue of interconnecting devices in integrated circuits as these circuits get smaller with each generation. Although aluminum was initially used as the metal for interconnecting, copper has emerged as a metal of choice. However, because of the fast diffusion of copper into the semiconductor insulator, the capacitive-resistive problem becomes an important issue that must be addressed. One solution is to use a liner, but with the reduction in the geometry of the circuits, the dimensions of the liner become inadequate to prevent the fast diffusion of copper. Another solution is to form a barrier material from the insulator and a copper alloy; this solution seems promising at first, but because the copper is alloyed, the desirable conductivity property of copper is diminished.

Thus, what is needed are structures and methods to inhibit the fast diffusion of copper so as to enhance the copper metallization layer in a semiconductor structure. The abovementioned problems with copper metallization layer as well as other problems are addressed by the present invention and will be understood by reading and studying the following specification. Systems, devices, structures, and methods are described which accord these benefits.

BRIEF DESCRIPTION OF THE DRAWINGS

FIG. 4 is a block diagram of a device according to one embodiment of the present invention.

DETAILED DESCRIPTION

Figure 1:
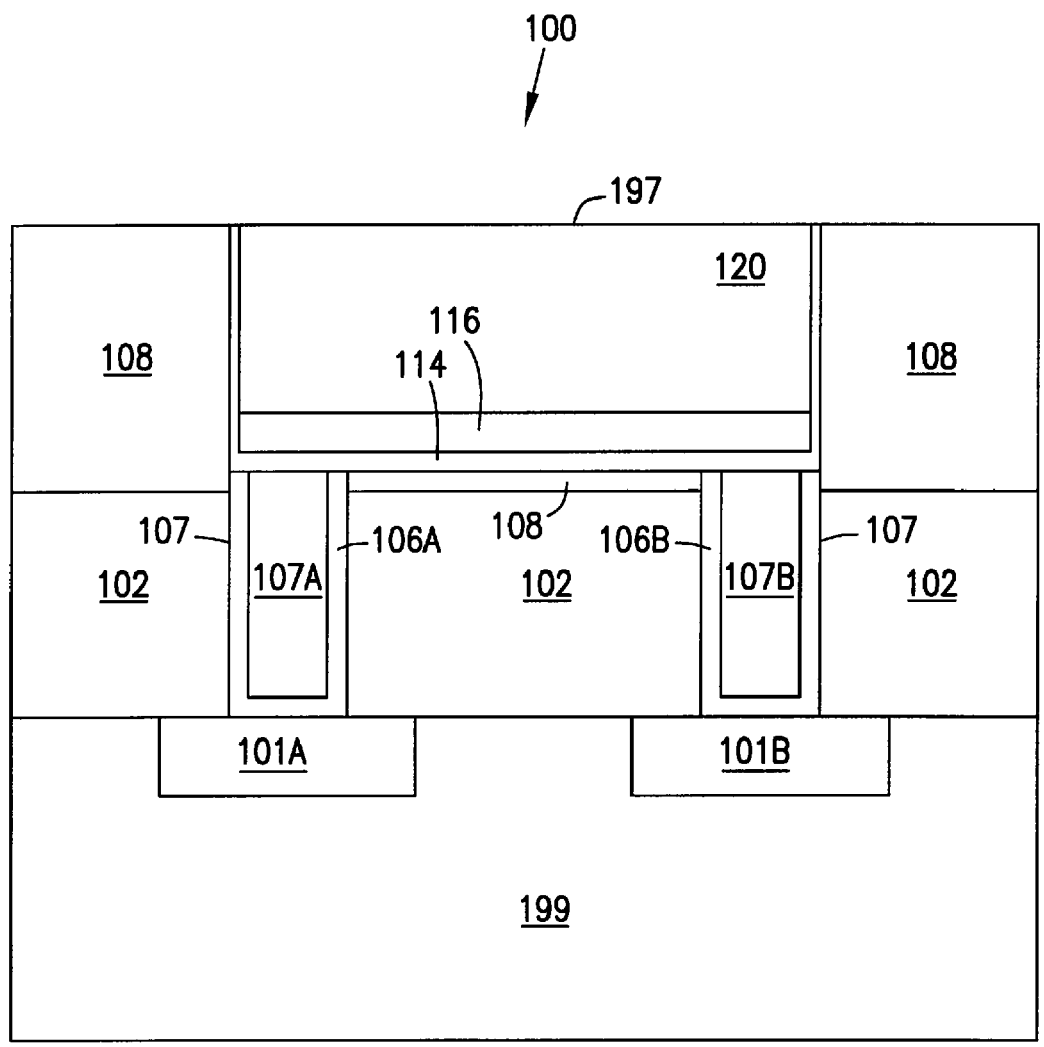
FIG. 1 is a cross-sectional view of a semiconductor structure according to one embodiment of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure and layer formed above, and the terms wafer or substrate include the underlying layers containing such regions/junctions and layers that may have been formed above. The following detailed description is, therefore, not to be taken in a limiting sense, and the scope of the present invention is defined only by the appended claims.

The embodiments described herein focus on the formation of an inhibiting layer interposed between an insulator and a copper metallization layer, which is not alloyed, so as to inhibit the undesired diffusion of copper into the insulator.

FIG. 1 is a cross-sectional view of a semiconductor structure according to one embodiment of the present invention. Semiconductor structure 100 includes a substrate 199, and a number of semiconductor device structures, such as devices 101A and 101B. Devices 101A and 101B include active devices, such as transistors, and passive devices, such as capacitors, or a combination of active and passive devices. The semiconductor structure 100 optionally includes a protective layer 102. In one embodiment, the protective layer 102 includes silicon nitride, such as trisilicon tetranitride. The purpose of the protective layer 102 includes acting as a protective layer to prevent the metallization layer from contacting the devices 101A and 101B. The semiconductor structure 100 includes a number of contacts 107. The contacts 107 provide electrical connection to the devices 101A and 101B. In one embodiment, the contacts 107 include a diffusion barrier, such as titanium silicide layers 106A and 106B, and a plug, such as tungsten layers 107A and 107B.

The semiconductor structure 100 includes an insulator layer 108. In one embodiment, the insulator layer 108 includes a substance that comprises a material selected from a group consisting of a polymer, a foamed polymer, a fluorinated polymer, a fluorinated-foamed polymer, an aerogel, and an insulator oxide compound. The polymer includes polyimide. The insulator oxide compound includes silicon dioxide. The semiconductor structure includes a copper seed layer 116 and a copper conductor layer 120. The copper seed layer 116 and the copper conductor layer 120 constitute a portion of a copper metallization layer 197.

The semiconductor structure 100 includes an inhibiting layer 114. Without this inhibiting layer 114, the copper atoms of the copper metallization layer 197 may diffuse into the insulator 108. This diffusion changes the microstructure of a portion of the semiconductor structure 100 and causes undesired capacitive-resistive effects. The presence of the inhibiting layer 114 inhibits the capacitive-resistive effects. One of the advantages of the inhibiting layer 114 over a liner is that the inhibiting layer 114 scales with the geometry of the semiconductor structure for each succeeding generation of technology. Another advantage of the inhibiting layer 114 over a formation of a barrier from a copper alloy is that the inhibiting layer 114 need not be comprised from a material that is from the copper conductor layer 120. This leaves the copper conductor layer 120 to be completely occupied by copper so as to enhance the electrical properties of the metallization layer 197 of the semiconductor structure 100.

In one embodiment, the inhibiting layer 114 comprises a compound formed from a reaction that includes the substance in the insulator 108 and a second substance. The second substance is selected from a group consisting of a transition metal, a representative metal, and a metalloid. The transition metal is selected from a group consisting of chromium, molybdenum, tungsten, titanium, zirconium, hafnium, vanadium, niobium, and tantalum. The representative metal includes elements from the alkaline earth metal. The representative metal includes aluminum and magnesium. The metalloid includes boron.

Figure 2A:
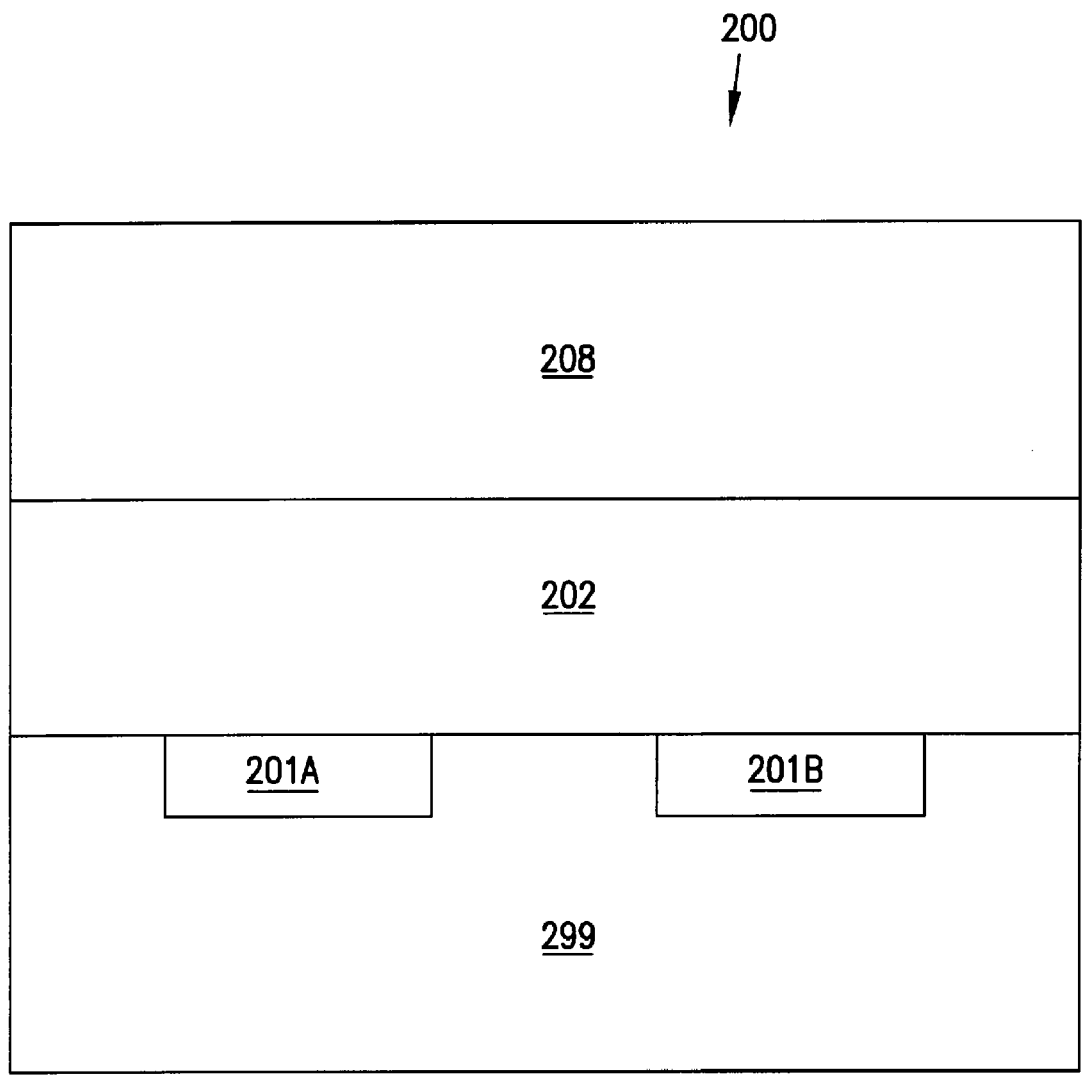
FIGS. 2A-2F are cross-sectional views of a semiconductor structure during processing according to one embodiment of the present invention.

FIGS. 2A-2F are cross-sectional views of a semiconductor structure during processing according to one embodiment of the present invention. FIG. 2A illustrates a portion of a semiconductor structure 200, such as an integrated circuit having a number of semiconductor devices, such as devices 201A and 201B. The formation of semiconductor devices, such as devices 201A and 201B, does not limit the embodiments of the present invention, and as such, will not be presented here in full. The devices 201A and 201B include active devices, such as transistors, and passive devices, such as capacitors, or a combination of active and passive devices.

The semiconductor structure 200 optionally includes a protective layer 202. The protective layer 202 is deposited over the substrate 299 and devices 201A and 201B. The deposition of the protective layer 202 includes depositing a layer of a substance that protects the devices 201A and 201B from subsequent conductive semiconductor layers. In one embodiment, this substance includes a nitride compound, such as silicon nitride. Silicon nitride includes a substance such as trisilicon tetranitride ($Si_3N_4$). In another embodiment, this layer of silicon nitride is deposited to a thickness in the range of about 100 to about 500 Angstroms.

The semiconductor structure 200 includes a first insulator layer 208. The first insulator layer 208 is deposited over the protective layer 202 although in one embodiment, the first insulator layer 208 may be formed before the formation of the protective layer 202. In one embodiment, the first insulator layer 208 abuts the protective layer 202 after deposition. In one embodiment, the first insulator layer 208 includes a first substance that is selected from a group consisting of an organic substance and an inorganic substance.

In one embodiment, the first substance of the first insulator layer 208 includes an organic substance that includes a material having a plurality of single-hydrocarbon molecules bonded together. In another embodiment, the material comprises at least two mers bonded together that have been treated so as to have a low dielectric constant. In another embodiment, the material is selected from a group consisting of a polymer, a foamed polymer, a fluorinated polymer, and a fluorinated-foamed polymer. Since a polymer includes polyimide, the material can be selected from a group consisting of a polyimide, a foamed polyimide, a fluorinated polyimide, and a fluorinated-foamed polyimide. In another embodiment, the material can be selected from a group consisting of DuPont PI-2801 material, a foamed DuPont PI-2801 material, a fluorinated DuPont PI-2801 material, and a fluorinated-foamed DuPont PI-2801 material. The material maybe foamed, for example, as described in U.S. Ser. No. 08/892,114, filed Jul. 14, 1997, entitled "Method of Forming Insulating Material for an Integrated Circuit and Integrated Circuits Resulting From Same," which is hereby incorporated by reference. In the embodiment that the material is a polyimide, the first insulator layer 208 is cured after deposition, forming a layer with a thickness of about 5000 Angstroms after curing. The method of curing the first insulator layer 208 does not limit the embodiments of the present invention, and as such, will not be presented here in full.

In another embodiment, the first substance of the first insulator layer 208 includes an inorganic substance that includes a material selected from a group consisting of an aerogel and an insulator oxide compound. The insulator oxide compound includes silicon dioxide.

The hereinbefore and hereinafter discussions are illustrative of one example of a portion of a fabrication process to be used in conjunction with the various embodiments of the invention. Other methods of fabrication are also included within the scope of the embodiments of the present invention. For clarity purposes, many of the reference numbers are eliminated from subsequent drawings so as to focus on the portion of interest of the semiconductor structure 200.

Figure 2B:
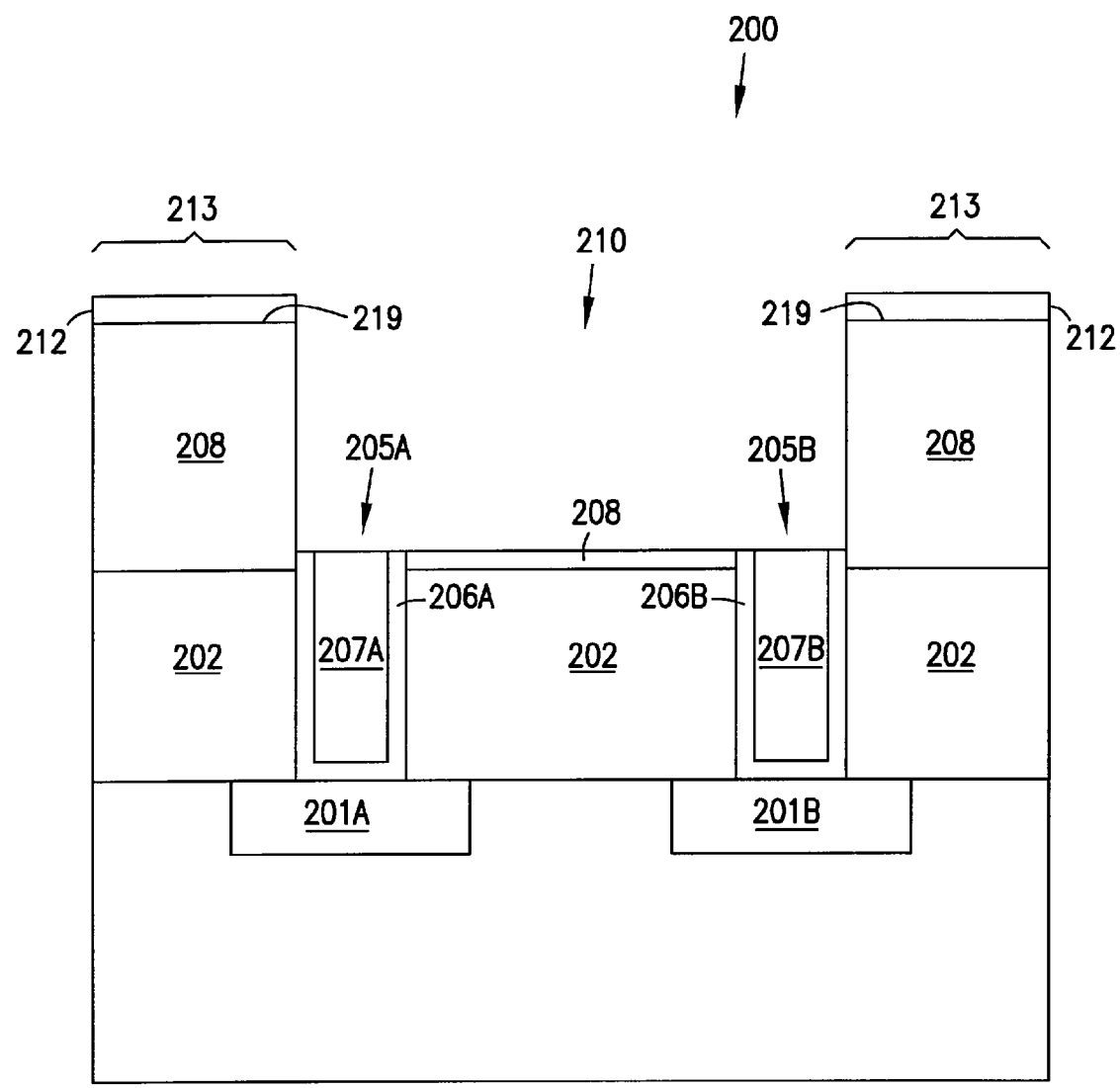

FIG. 2B shows the semiconductor structure following the next sequence of processing. Vias 205A and 205B are opened to devices 201A and 201B using a photolithography technique. The term "vias" means the inclusion of contact holes and contact plugs. A suitable photolithography technique and an etching process can be chosen without limiting the embodiments of the present invention, and as such, it will not be presented here in full. In one embodiment, a first contact material, such as titanium silicide layers 206A and 206B, is placed in the vias 205A and 205B, through a process such as chemical vapor deposition (CVD). Next, a second contact material, such as tungsten plugs 206A and 206B, can be deposited in the vias 205A and 205B. The tungsten plugs 206A and 206B can be deposited in the vias 205A and 205B using any suitable technique such as a CVD process. The excess titanium silicide or tungsten can be removed from the wafer surface by chemical mechanical planarization (CMP) or other suitable processes to form a planarized surface.

The first insulator layer 208 is patterned to define a number of trenches, such as trench 210. The term "trench" means the inclusion of lines for electrically interconnecting devices in a semiconductor structure. In one embodiment, the first insulator layer 208 has a first predetermined thickness and the trench 210 has a second predetermined thickness such that the second predetermined thickness of the trench 210 is proportional to the first predetermined thickness of the first insulator layer 208. The trench 210 is located in the first insulator layer 208 so as to open up the semiconductor structure 200 to a number of first level vias, such as vias 205A and 205B. In other words, a first level copper metallization layer pattern 210 is defined in a mask layer of photoresist 212. Then, the first insulator layer 208 is etched, using any suitable process, such as reactive ion etching (RIE), such that the first level copper metallization layer pattern 210 is defined in the first insulator layer 208. In one embodiment, a residual photoresist layer 212 is left in place on the first insulator layer 108 in a number of regions 213 outside of the number trenches 210.

In one embodiment, the formation of vias 205A and 205B and the trench 210 is made using a damascene technique, such as the dual or triple damascene process. The structure is now as it appears in FIG. 2B.

Figure 2C:
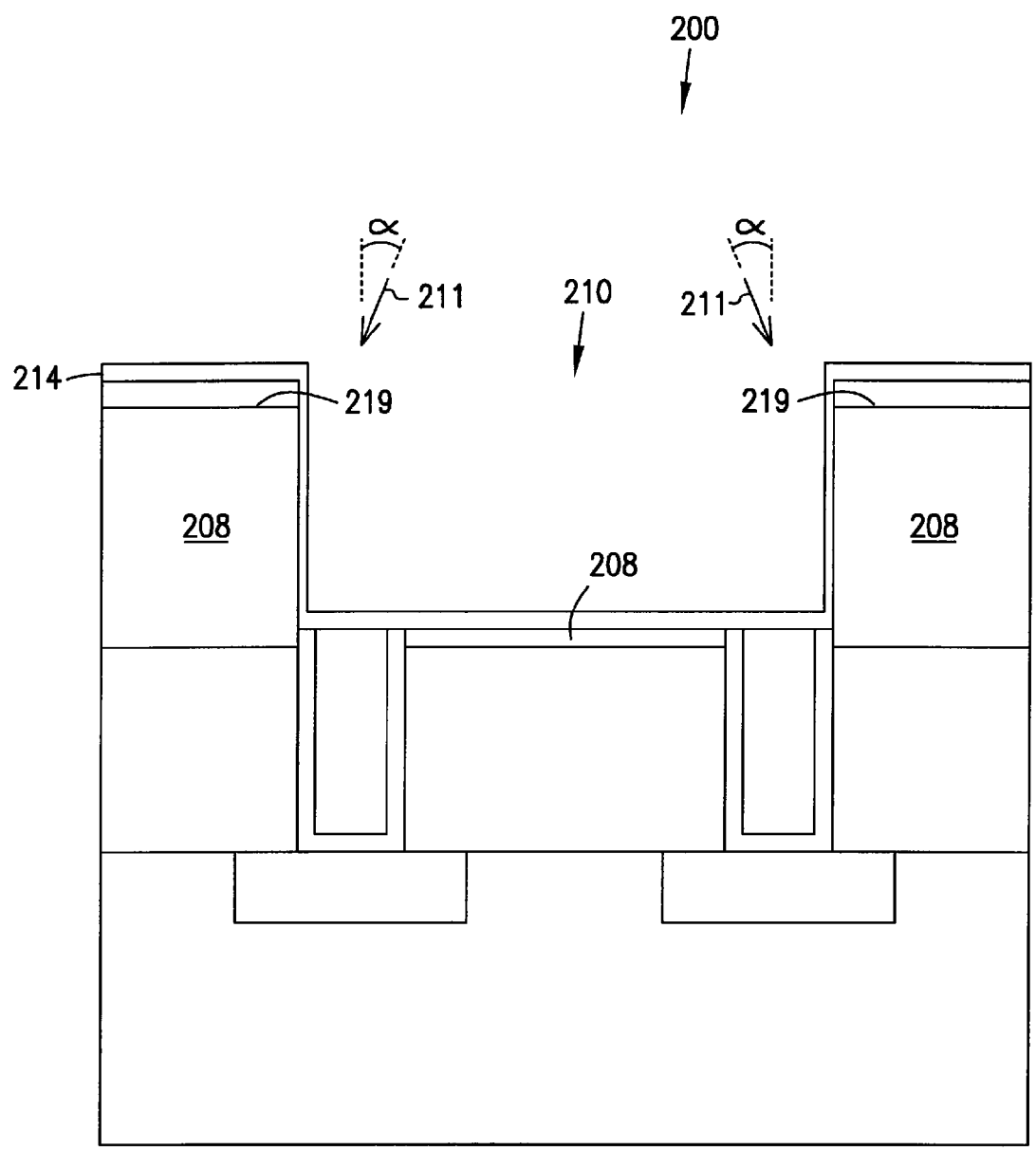

FIG. 2C shows the semiconductor structure following the next sequence of processing. An inhibiting layer 214 is formed in the trench 210. In one embodiment, the forming of the inhibiting layer 214 includes depositing a second substance using a technique selected from a group consisting of low-energy implantation and chemical-vapor deposition. The second substance is selected from a group consisting of a transition metal, a representative metal, and a metalloid. In addition to depositing the second substance, the forming of the inhibiting layer 214 includes reacting the first substance of the insulator layer 208 and the second substance to form a compound so as to inhibit undesired atomic migration. In one embodiment, the reacting process includes reacting to form an in situ barrier. In another embodiment, the reacting process includes an annealing process. In yet another embodiment, the reacting process is accomplished prior to the completion of the semiconductor structure 200.

In the embodiment that the second substance is a transition metal, the second substance is selected from a group consisting of chromium, molybdenum, tungsten, titanium, zirconium, hafnium, vanadium, niobium, and tantalum. In the embodiment that the second substance is a representative metal, the second substance includes an alkaline earth metal. In another embodiment, in which the second substance is a representative metal, the second substance includes aluminum and magnesium. In the embodiment in which the second substance is a metalloid, the second substance includes boron. In the embodiment in which the second substance is either zirconium, aluminum, or an alkaline earth metal, the second substance is deposited with a thickness of about 5 Angstroms to about 40 Angstroms. In the embodiment in which the second substance is an alkaline earth metal, the second substance includes magnesium.

In various embodiments, the depositing process of forming the inhibiting layer 214 includes implanting the second substance using a low-energy implantation technique with an implantation energy of about 100 electron-volts to about 2000 electron-volts. In various embodiments, the depositing process of forming the inhibiting layer 214 includes depositing in a temperature of about 250 degrees Celsius to about 375 degrees Celsius. In another embodiment, the temperature includes 325 degrees Celsius.

In various embodiments, the second substance is deposited into the surfaces of the trench 210 using a depositing technique where the angle of deposition 211 is varied about 3 degrees to about 15 degrees from normal with respect to the surface of the wafer. In other words, the angle is varied from normal with respect to the planarized surface. In various embodiments, the angle of implantation 211 is dependent on the height-to-width ratio of the semiconductor structure.

In one embodiment, the first insulator layer 208 includes the first substance selected from a polyimide or a foamed polyimide, the second substance is selected from zirconium, and the depositing of the second substance is a low-energy implantation technique. Zirconium is implanted using a dose of about $5 \times 10^{16}$ ions per square centimeter. The implantation energy used is about 400 electron-volts to about 600 electron-volts. The angle of implantation 211 varies from about 5 degrees to about 10 degrees from normal with respect to the first insulator layer 208. In one embodiment, zirconium is deposited with a thickness of about 5 Angstroms to about 40 Angstroms. In another embodiment, zirconium is deposited with a thickness of about 10 Angstroms to about 30 Angstroms. In another embodiment, zirconium is deposited with a thickness of about 20 Angstroms. In this embodiment, the reacting process of forming the compound of the inhibiting layer includes reacting at a temperature of about 325 degrees Celsius to about 375 degrees Celsius. In one embodiment, the time for the reacting process is from about 27 minutes to about 33 minutes. In one embodiment, the duration of the reacting process is 30 minutes.

In one embodiment, the first insulator layer 208 includes the first substance being selected from an insulator oxide compound, the second substance being selected from aluminum, and the depositing of the second substance being executed by a low-energy implantation technique. Aluminum is implanted using a dose of about $5 \times 10^{16}$ ions per square centimeter. The implantation energy used is about 400 electron-volts. The angle of implantation 211 varies from about 5 degrees to about 10 degrees from normal with respect to the first insulator layer 208. In one embodiment, aluminum is deposited with a thickness of about 5 Angstroms to about 40 Angstroms. In another embodiment, aluminum is deposited with a thickness of about 10 Angstroms to about 30 Angstroms. In another embodiment, aluminum is deposited with a thickness of about 20 Angstroms. In this embodiment, the reacting process of forming the compound of the inhibiting layer 214 includes reacting at a temperature of about 325 degrees Celsius to about 375 degrees Celsius. In one embodiment, the duration for the reacting process is from about 27 minutes to about 33 minutes. In one embodiment, the duration of the reacting process is 30 minutes.

Figure 2D:
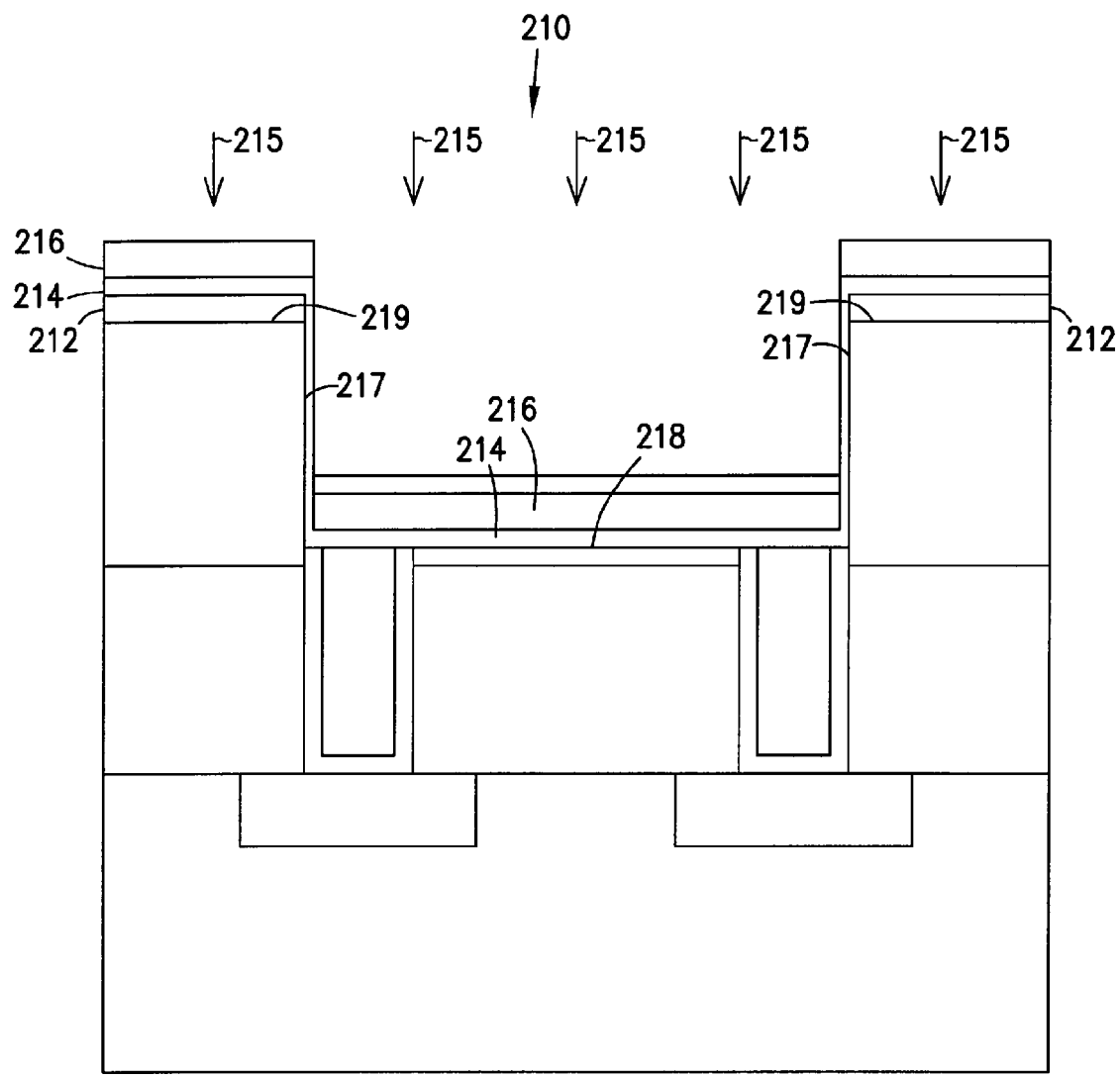

FIG. 2D shows the semiconductor structure following the next sequence of processing. A first seed layer 216 is deposited on the inhibiting layer 214 using a low-energy ion implantation. In one embodiment, depositing the seed layer 216 on the inhibiting layer 214 includes depositing a copper seed layer 216. In one embodiment, depositing the seed layer 216 includes depositing copper seed layer 216 having a thickness of about 100 Angstroms. This can be achieved using an $8 \times 10^{16}$ ion implantation of copper. In one embodiment, the energy of implantation includes about 100 electron-volts. Additionally, the copper seed layer 216 is implanted at an angle 215 normal to the planarized surface. Implanting the copper seed layer 216 at an angle normal to the planarized surface would result in the copper seed layer 216 being parallel to a bottom surface 218 in the trench 210. The copper seed layer 216 is deposited to a much lesser extent on the side surfaces 217 of the trench 210.

Figure 2E:
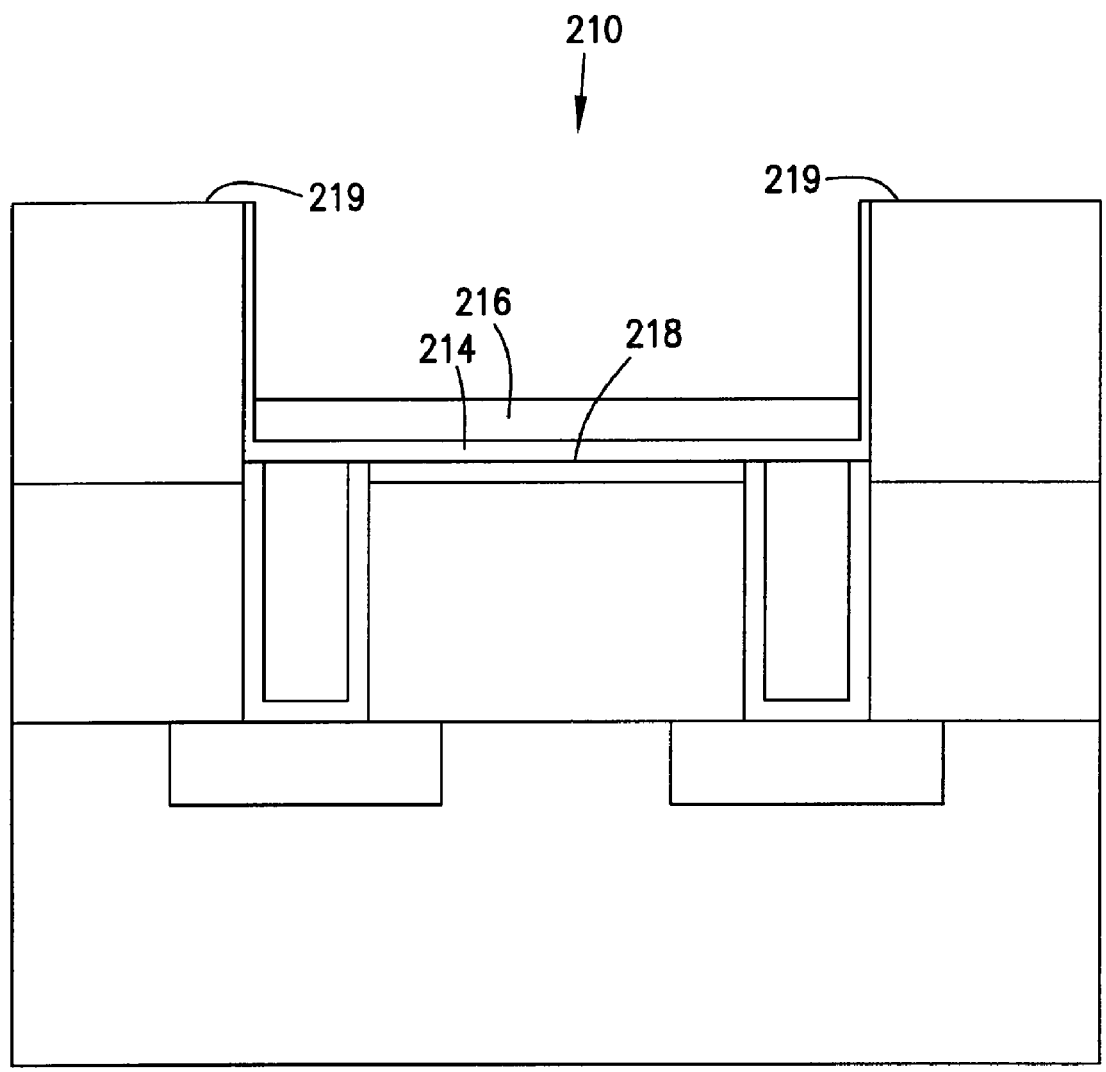

FIG. 2E shows the semiconductor structure following the next sequence of processing. Returning briefly to FIG. 2D, the residual photoresist layer 212 has served as a blocking layer to define the implant areas for the inhibiting layer 214, and the copper seed layer 216. In one embodiment, the residual photoresist layer 212 is removed using a wet-strip process. In another embodiment, the residual photoresist layer 212 is removed using a tape lift-off technique. In yet another embodiment, the residual photoresist layer 212 is removed using a tape lift-off technique in combination with a wet-strip process. The tape lift-off technique In one embodiment, removing the residual photoresist layer 212 includes removing the unwanted copper seed layer 216, and the unwanted inhibiting layer 214 from a portion of the surface of the wafer. Such a portion of the surface of the wafer may include a number of regions outside of the trench 210 near the vicinity of the top surface 219. The semiconductor structure will now appear as shown in FIG. 2E.

Figure 2F:
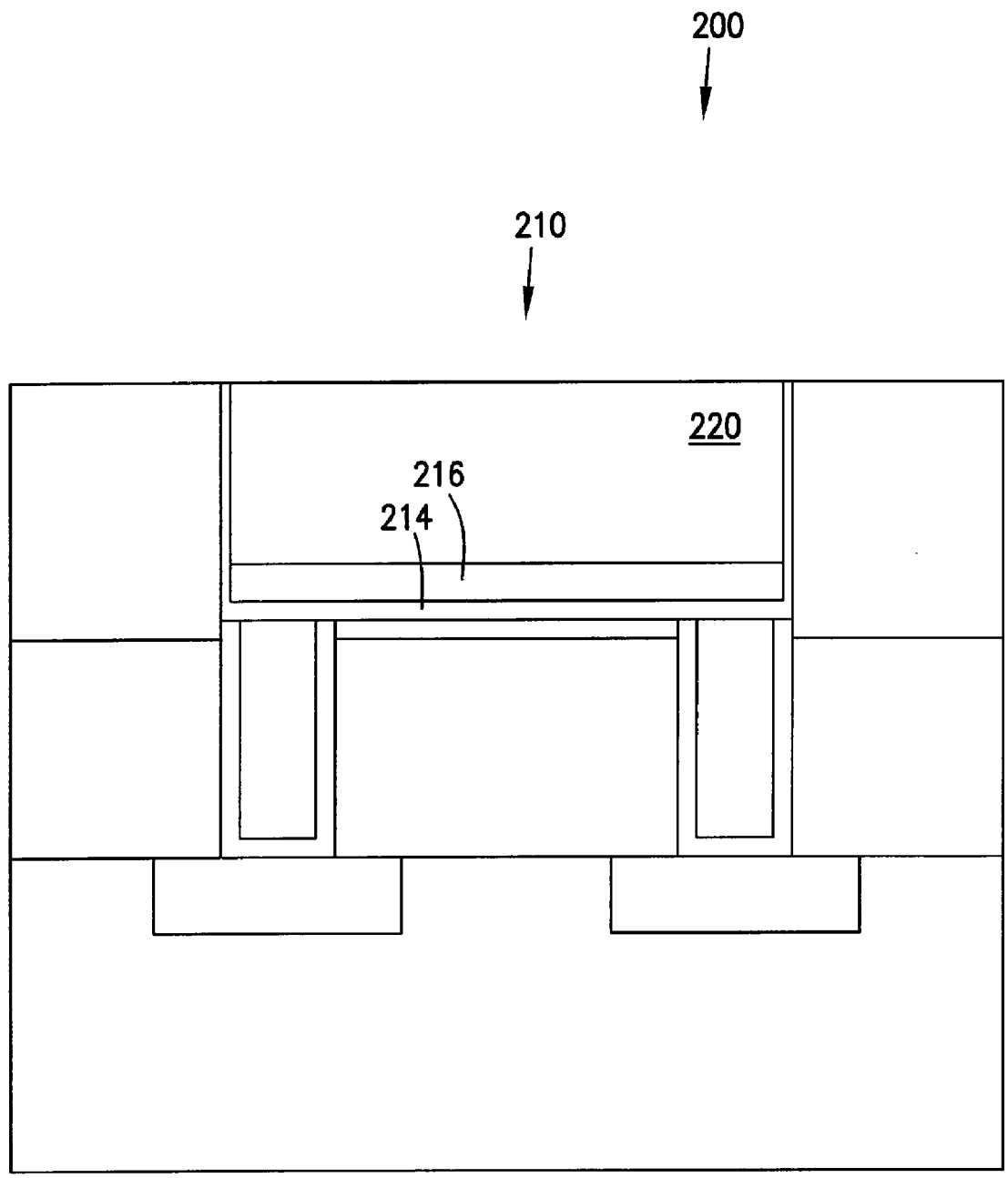

FIG. 2F shows the semiconductor structure following the next sequence of processing. The semiconductor structure 200 includes a copper metallization layer 220. The copper metallization layer 220 is selectively formed on the copper seed layer 216 in the trench 210. The copper metallization layer 220 includes copper as an element in its composition. In one embodiment, the copper metallization layer 220 is deposited using a selective CVD process. In another embodiment, depositing the metallization layer 220 includes depositing a copper metallization layer 220 using electroplating or electroless plating.

In the embodiment in which the second substance is zirconium, the semiconductor structure 200 is heat-treated at about 250 degrees Celsius to about 350 degrees Celsius from about one to about two hours after the electroplating of the copper.

The embodiments as described above in FIGS. 2A to FIG. 2F may be iterated to form any number of subsequent copper metallization layers in a multi-layer wiring structure. The term "wiring structure" means the inclusion of a contacting and interconnecting structure in an integrated circuit so as to electrically connect various devices together. The term "wiring structure" means the inclusion of at least one copper metallization layer.

Figure 3A:
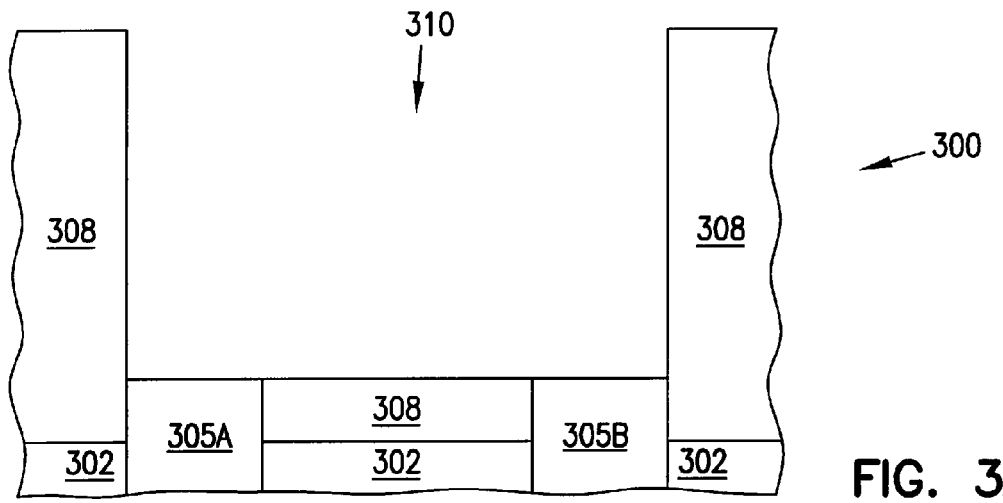
FIGS. 3A-3C are closed-up cross-sectional views of a semiconductor structure during processing according to one embodiment of the present invention.
Figure 3B:
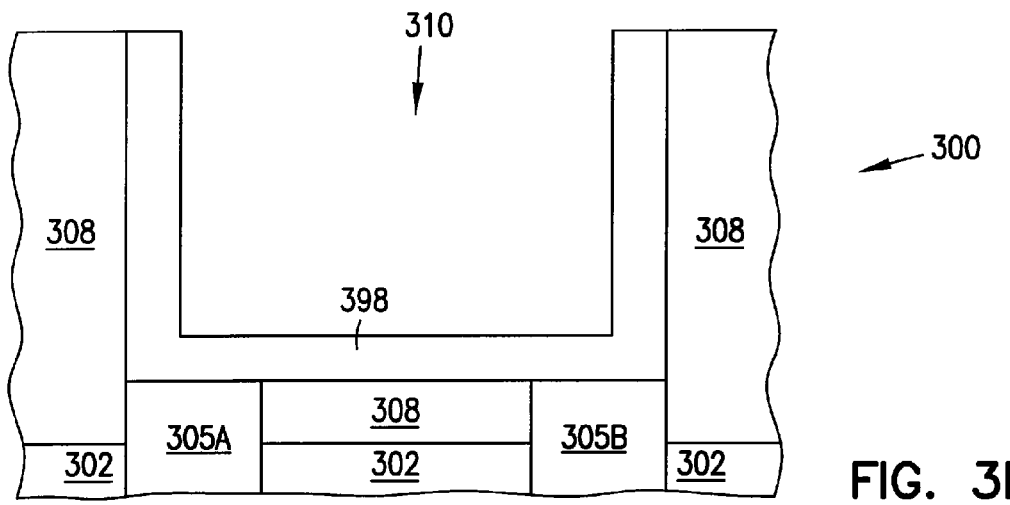
Figure 3C:
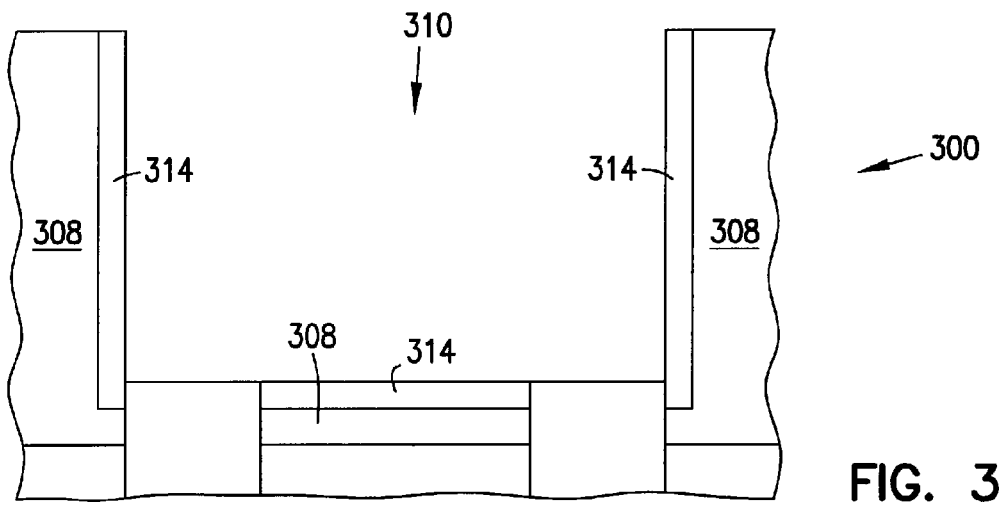

FIGS. 3A-3C are closed-up cross-sectional views of a semiconductor structure during processing according to one embodiment of the present invention. FIG. 3A shows a closed-up cross-sectional view of a semiconductor structure 300 during processing. Semiconductor structure 300 includes elements that are similar to elements discussed in FIGS. 2A-2F. The discussion of those elements that are similar and have an identical last-two digit nomenclature is incorporated here in full.

FIG. 3A includes a trench 310 that is defined by the current shape of protective layer 302, an insulator 308, and vias 305A and 305B. The insulator 308 includes a first substance. The trench 310 has been defined to begin the formation of a copper metallization layer. In subsequent processing steps, the trench 310 may be filled with copper to complete the formation of a copper metallization layer. As discussed hereinbefore, the formation of a copper metallization layer into the trench 310, without the various embodiments of the present invention, may cause the undesired diffusion of copper atoms into the insulator 308.

FIG. 3B shows the next sequence of processing. A layer of a second substance is deposited abutting the insulator layer 308 and the vias 305A and 305B. The second substance occupies a portion of the trench 310.

FIG. 3C shows the next sequence of processing. An inhibiting layer 314 is formed from the first substance of the insulator 308 and the second substance 398. This inhibiting layer 314 helps to enhance the copper metallization layer. In one embodiment, because the inhibiting layer 314 forms an integral part of the insulator 308, the inhibiting layer 314 is effective in inhibiting the diffusion of the copper metallization layer. In another embodiment, because the inhibiting layer 314 forms an integral part of the semiconductor structure 300, it scales with each succeeding generation of semiconductor processing technology so as to maintain an effective inhibiting layer against the capacitive-resistive effects. In another embodiment, because the inhibiting layer 314 occupies a portion of the space of the insulator 308 but not the space of the trench 310, more of the space of the trench 310 can be used for the deposition of copper. Thus, the metallization layer of the described embodiments is enhanced.

FIG. 4 is a block diagram of a device according to one embodiment of the present invention. The memory device 400 includes an array of memory cells 402, address decoder 404, row access circuitry 406, column access circuitry 408, control circuitry 410, and input/output circuit 412. The memory device 400 can be coupled to an external microprocessor 414, or memory controller for memory accessing. The memory device 400 receives control signals from the processor 414, such as WE*, RAS* and CAS* signals. The memory device 400 is used to store data which is accessed via I/O lines. It will be appreciated by those skilled in the art that additional circuitry and control signals can be provided, and that the memory device 400 has been simplified to help focus on the invention. At least one of the memory cells has an inhibiting layer in accordance with the aforementioned embodiments. In one embodiment, at least one of the memory cells has a capacitor and at least one transistor that are interconnected through a semiconductor structure in accordance with the aforementioned embodiments.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Figure 5:
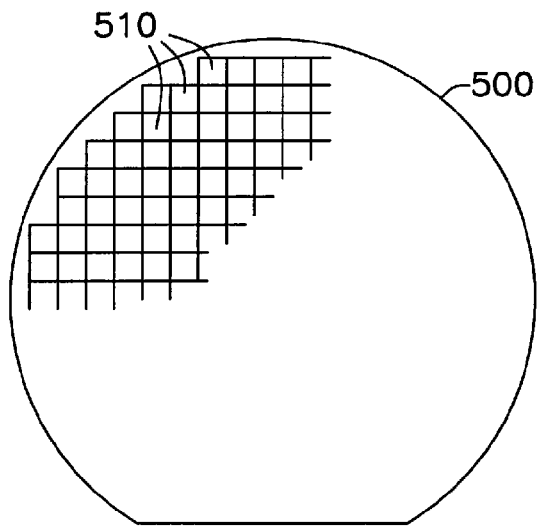
FIG. 5 is an elevation view of a semiconductor wafer according to one embodiment of the present invention.

FIG. 5 is an elevation view of a semiconductor wafer according to one embodiment of the present invention. In one embodiment, a semiconductor die 510 is produced from a wafer 500. A die is an individual pattern, typically rectangular, on a substrate that contains circuitry, or integrated circuit devices, to perform a specific function. At least one of the integrated circuit devices includes a memory cell as discussed in the various embodiments heretofore in accordance with the invention. A semiconductor wafer will typically contain a repeated pattern of such dies containing the same functionality. Die 510 may contain circuitry for the inventive memory device, as discussed above. Die 510 may further contain additional circuitry to extend to such complex devices as a monolithic processor with multiple functionality. Die 510 is typically packaged in a protective casing (not shown) with leads extending therefrom (not shown) providing access to the circuitry of the die for unilateral or bilateral communication and control. In one embodiment, at least two of the integrated circuit devices are interconnected through a semiconductor structure as discussed in the aforementioned embodiments.

Figure 6:
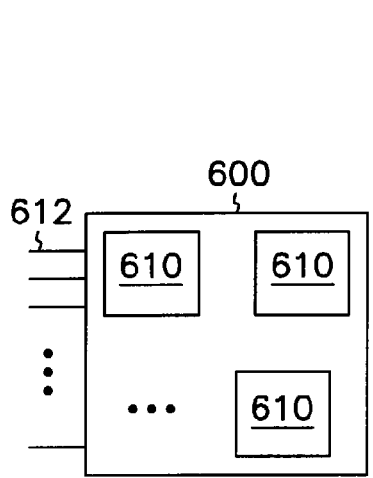
FIG. 6 is a block diagram of a circuit module according to one embodiment of the present invention.

FIG. 6 is a block diagram of a circuit module according to one embodiment of the present invention. Two or more dies 610 may be combined, with or without protective casing, into a circuit module 600 to enhance or extend the functionality of an individual die 610. Circuit module 600 may be a combination of dies 610 representing a variety of functions, or a combination of dies 610 containing the same functionality. One or more dies 610 of circuit module 600 contain at least one of the semiconductor structure to enhance a copper metallization layer in accordance with the aforementioned embodiments of the present invention.

Some examples of a circuit module include memory modules, device drivers, power modules, communication modems, processor modules, and application-specific modules, and may include multilayer, multichip modules. Circuit module 600 may be a subcomponent of a variety of electronic systems, such as a clock, a television, a cell phone, a personal computer, an automobile, an industrial control system, an aircraft, and others. Circuit module 600 will have a variety of leads 612 extending therefrom and coupled to the dies 610 providing unilateral or bilateral communication and control.

Figure 7:
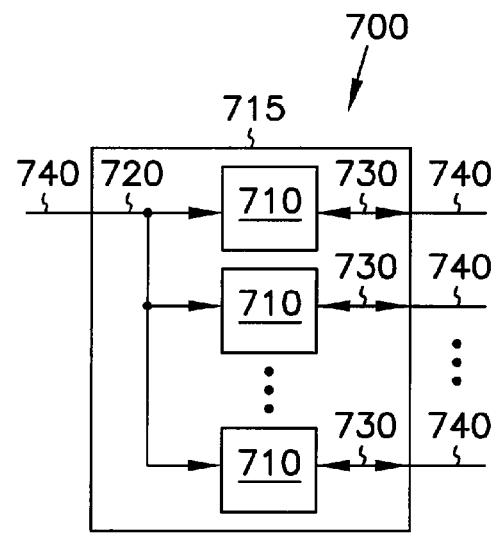
FIG. 7 is a block diagram of a memory module according to one embodiment of the present invention.

FIG. 7 is a block diagram of a memory module according to one embodiment of the present invention. Memory module 700 contains multiple memory devices 710 contained on support 715, the number depending upon the desired bus width and the desire for parity. Memory module 700 accepts a command signal from an external controller (not shown) on a command link 720 and provides for data input and data output on data links 730. The command link 720 and data links 730 are connected to leads 740 extending from the support 715. Leads 740 are shown for conceptual purposes and are not limited to the positions as shown. At least one of the memory devices 710 includes a memory cell as discussed in various embodiments in accordance with the invention.

Figure 8:
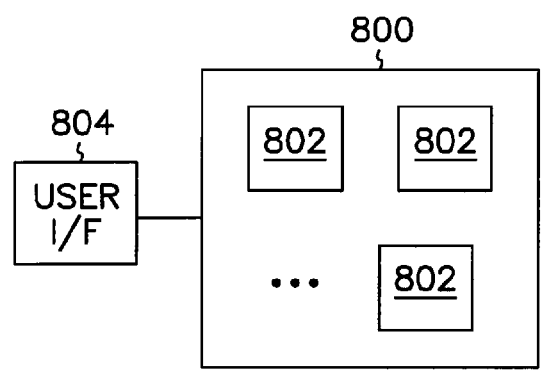
FIG. 8 is a block diagram of a system according to one embodiment of the present invention.

FIG. 8 is a block diagram of a system according to one embodiment of the present invention. Electronic system 800 contains one or more circuit modules 802. Electronic system 800 generally contains a user interface 804. User interface 804 provides a user of the electronic system 800 with some form of control or observation of the results of the electronic system 800. Some examples of user interface 804 include the keyboard, pointing device, monitor, or printer of a personal computer; the tuning dial, display, or speakers of a radio; the ignition switch, gauges, or gas pedal of an automobile; and the card reader, keypad, display, or currency dispenser of an automated teller machine. User interface 804 may further describe access ports provided to electronic system 800. Access ports are used to connect an electronic system to the more tangible user interface components previously exemplified. One or more of the circuit modules 802 may be a processor providing some form of manipulation, control, or direction of inputs from or outputs to user interface 804, or of other information either preprogrammed into, or otherwise provided to, electronic system 800. As will be apparent from the lists of examples previously given, electronic system 800 will often contain certain mechanical components (not shown) in addition to circuit modules 802 and user interface 804. It will be appreciated that the one or more circuit modules 802 in electronic system 800 can be replaced by a single integrated circuit. Furthermore, electronic system 800 may be a subcomponent of a larger electronic system. At least one of the circuit modules 802 includes at least an integrated circuit that comprises at least two semiconductor devices that are interconnected through a semiconductor structure as discussed in various embodiments in accordance with the invention.

Figure 9:
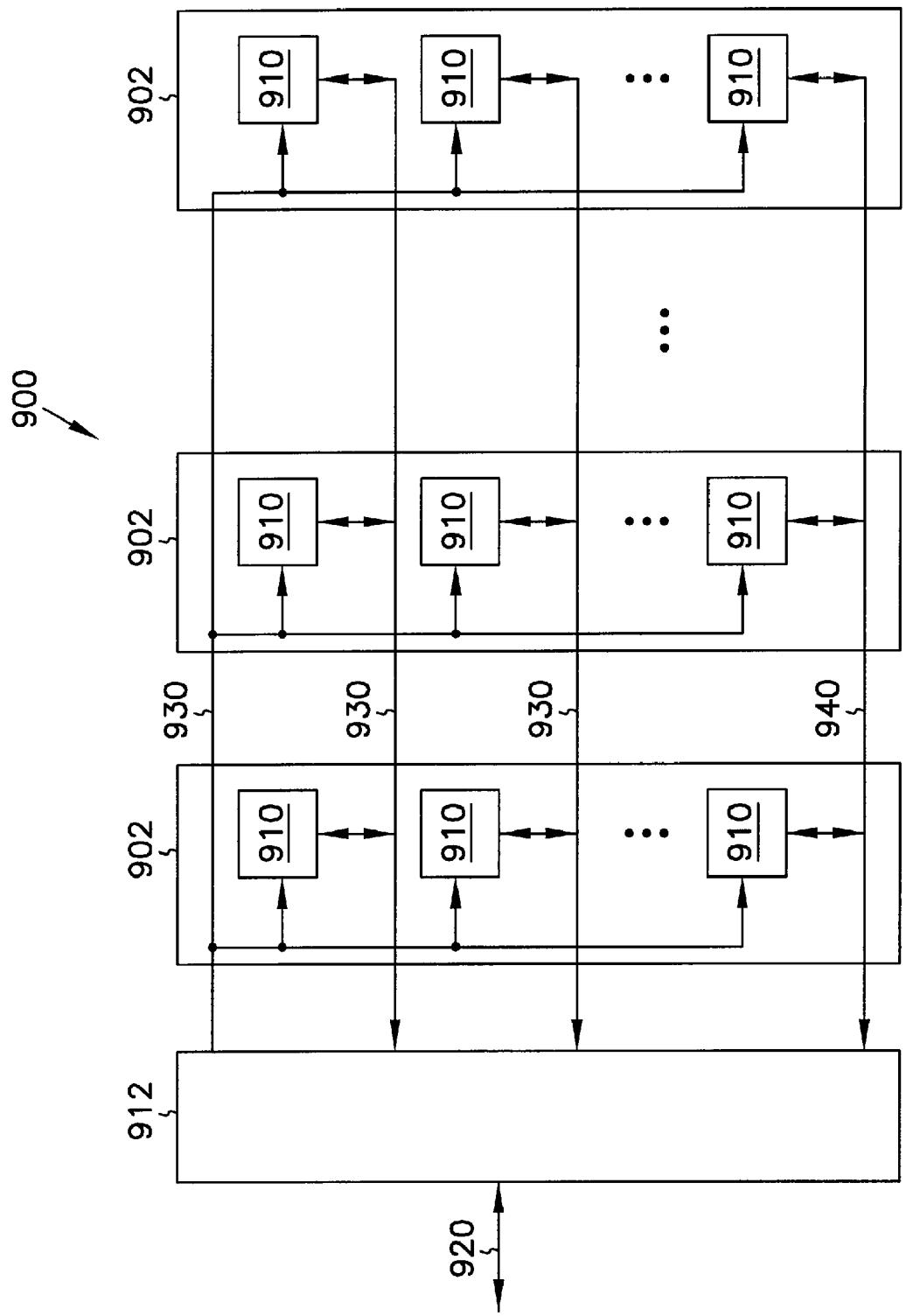
FIG. 9 is a block diagram of a system according to one embodiment of the present invention.

FIG. 9 is a block diagram of a system according to one embodiment of the present invention. Memory system 900 contains one or more memory modules 902 and a memory controller 912. Each memory module 902 includes at least one memory device 910. Memory controller 912 provides and controls a bidirectional interface between memory system 900 and an external system bus 920. Memory system 900 accepts a command signal from the external bus 920 and relays it to the one or more memory modules 902 on a command link 930. Memory system 900 provides for data input and data output between the one or more memory modules 902 and external system bus 920 on data links 940. At least one of the memory devices 910 includes a memory cell that includes an inhibiting layer as discussed in various embodiments in accordance with the invention.

Figure 10:
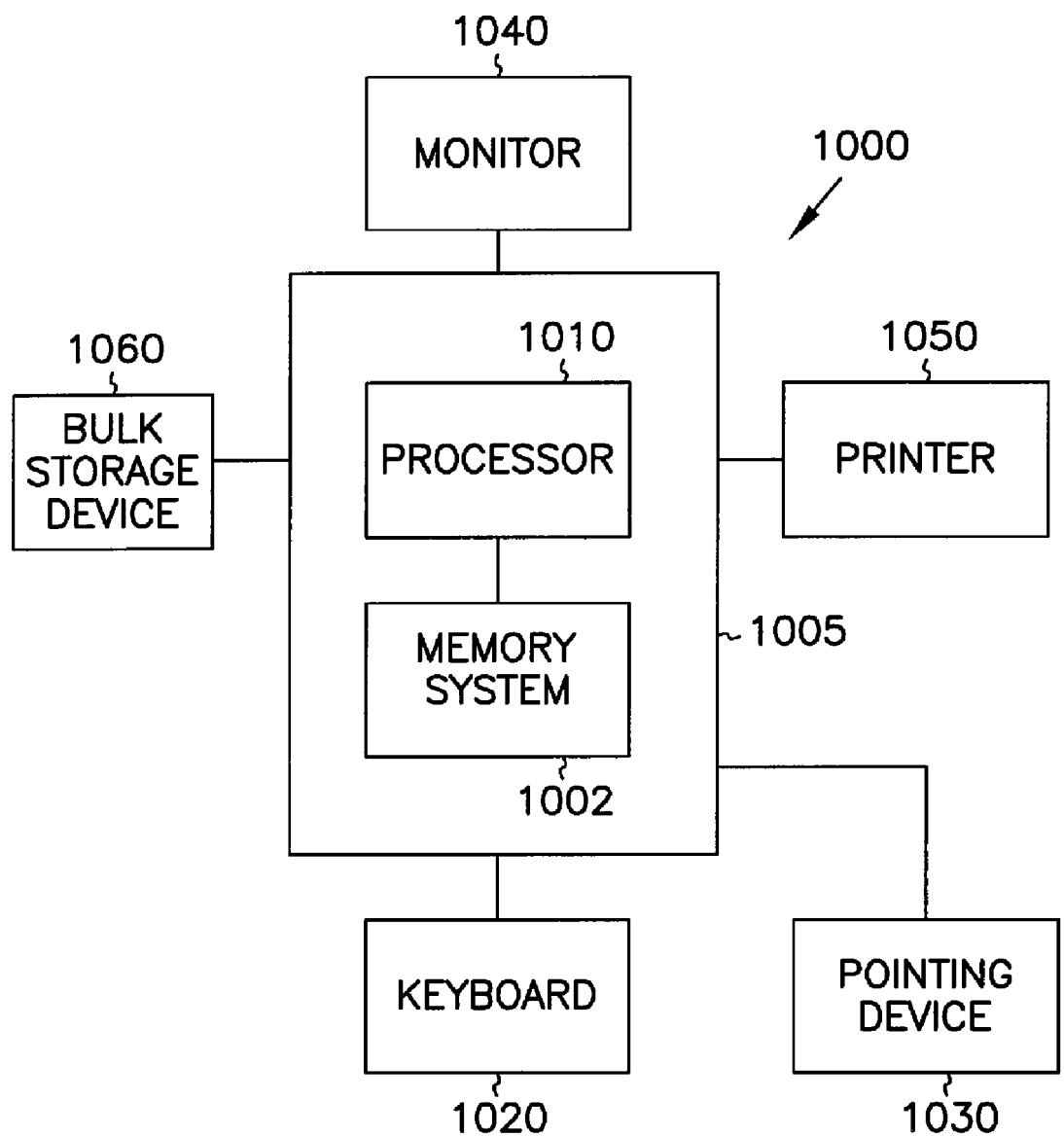
FIG. 10 is a block diagram of a system according to one embodiment of the present invention.

FIG. 10 is a block diagram of a system according to one embodiment of the present invention. Computer system 1000 contains a processor 1010 and a memory system 1002 housed in a computer unit 1005. The processor 1010 may contain at least two semiconductor devices that are interconnected through a semiconductor structure as described hereintofore. Computer system 1000 is but one example of an electronic system containing another electronic system, e.g., memory system 1002, as a subcomponent. The memory system 1002 may include a memory cell as discussed in various embodiments of the present invention. Computer system 1000 optionally contains user interface components. These user interface components include a keyboard 1020, a pointing device 1030, a monitor 1040, a printer 1050, and a bulk storage device 1060. It will be appreciated that other components are often associated with computer system 1000 such as modems, device driver cards, additional storage devices, etc. It will further be appreciated that the processor 1010 and memory system 1002 of computer system 1000 can be incorporated on a single integrated circuit. Such single-package processing units reduce the communication time between the processor and the memory circuit.

CONCLUSION

Structures and methods have been described to address situations where a metallization layer acts with an insulator layer such that a capacitive-resistive effect arises. Such an effect is inhibited by the embodiments of the present invention, and at the same time, the metallization layer is enhanced. As described heretofore, the inhibiting layer inhibits diffusion between copper and an insulator layer. Such an inhibition layer is formed without the need to use a copper alloy.

An illustrative embodiment includes a method for preparing a copper wiring system for ultra-large-scale integrated circuits. This copper wiring system has a high conductivity and low capacitive loading.

Another illustrative embodiment includes a method for constructing an insulator, such as an oxide compound or a polymer structure. The insulator is made impervious to the copper, which is not alloyed. Because the copper is not alloyed, the copper can have as low a resistivity as possible depending on the method of deposition and the resulting microstructure.

Another illustrative embodiment includes a method for forming an enhanced metallization layer. The method comprises forming an insulator layer having a first substance. The first substance comprises a material selected from a group consisting of a polymer, a foamed polymer, a fluorinated polymer, a fluorinated-foamed polymer, and an oxide compound. The method further comprises forming an inhibiting layer on the insulator layer. The forming of the inhibiting layer includes depositing a second substance on the insulator layer using a technique selected from a group consisting of low-energy implantation and chemical vapor deposition. The second substance is selected from a group consisting of a transition metal, a representative metal, and a metalloid. The process of forming the inhibiting layer includes reacting the first substance and the second substance to form a compound so as to inhibit undesired atomic migration. The method further comprises forming a copper metallization layer on the inhibiting layer.

Another illustrative embodiment includes a semiconductor structure. The structure comprises an insulator layer having a first substance. The first substance is selected from a group consisting of a polymer, a foamed polymer, a fluorinated polymer, a fluorinated-foamed polymer, an aerogel, and an insulator oxide compound. The polymer includes polyimide. The insulator oxide compound includes silicon dioxide. The semiconductor structure includes an inhibiting layer on the insulator layer. The inhibiting layer comprises a compound formed from a reaction that includes the first substance and a second substance. The second substance is selected from a group consisting of a transition metal, a representative metal, and a metalloid. The transition is selected from a group consisting of chromium, molybdenum, tungsten, titanium, zirconium, hafnium, vanadium, niobium, and tantalum. The representative metal is selected from a group consisting of aluminum and magnesium. The metalloid includes boron. The semiconductor structure also includes a copper metallization layer on the inhibiting layer.

These and other embodiments, aspects, advantages, and features of embodiments of the present invention are set forth in part in the description herein, and in part will become apparent to those skilled in the art by reference to the present description and referenced drawings or by practice of the invention. The aspects, advantages, and features of the invention are realized and attained by means of the instrumentalities, procedures, and combinations particularly pointed out in the appended claims.

Although the specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

I claim:

1. A semiconductor structure comprising:
   an insulator layer having a first substance, wherein the first substance comprises a material having a plurality of single hydrocarbon molecules bonded together;
   an atomic migration inhibiting layer on the insulator layer, wherein the atomic migration inhibiting layer includes a compound formed from the first substance and a second substance; and
   a copper metallization layer on the inhibiting layer.

2. The semiconductor structure of claim 1, wherein the first substance is selected from a group consisting of a polymer and a foamed polymer.

3. The semiconductor structure of claim 2, wherein the first substance is selected from a group consisting of a polyimide and a foamed polyimide.

4. The semiconductor structure of claim 1, wherein the insulator layer comprises at least two polymers bonded together that have a low dielectric constant.

5. The semiconductor structure of claim 1, wherein the inhibiting layer includes zirconium.

6. The semiconductor structure of claim 5, wherein the inhibiting layer includes a layer of zirconium with a thickness of about 5 Angstroms to about 40 Angstroms.

7. The semiconductor structure of claim 5, wherein the inhibiting layer includes a layer of zirconium with a thickness of about 10 Angstroms to about 30 Angstroms.

8. The semiconductor structure of claim 5, wherein the inhibiting layer includes a layer of zirconium with a thickness of about 20 Angstroms.

9. The semiconductor structure of claim 8, wherein the first substance includes a polymer.

10. The semiconductor structure of claim 9, wherein the insulator layer comprises at least two polymers bonded together that have a low dielectric constant.

11. The semiconductor structure of claim 9, wherein the insulator layer comprises a fluorinated polymer.

12. The semiconductor structure of claim 5, wherein the first substance includes a polymer.

13. The semiconductor structure of claim 1, wherein the inhibiting layer includes aluminum.

14. The semiconductor structure of claim 13, wherein the inhibiting layer includes a layer of aluminum with a thickness of about 5 Angstroms to about 40 Angstroms.

15. The semiconductor structure of claim 13, wherein the inhibiting layer includes a layer of aluminum with a thickness of about 20 Angstroms to about 30 Angstroms.

16. The semiconductor structure of claim 13, wherein the inhibiting layer includes a layer of aluminum with a thickness of about 20 Angstroms.

17. The semiconductor structure of claim 16, wherein the first substance includes a polymer.

18. The semiconductor structure of claim 12, wherein the first substance includes a polymer.

19. The semiconductor structure of claim 18, wherein the insulator layer comprises at least two polymer layers bonded together that have a low dielectric constant.

20. The semiconductor structure of claim 19, wherein the insulator layer comprises a fluorinated polymer.

21. The semiconductor structure of claim 1, wherein the copper metallization layer includes a thickness proportional to a thickness of the inhibiting layer.

* * * * *